(12) United States Patent
Song et al.

(10) Patent No.: US 11,763,701 B2
(45) Date of Patent: Sep. 19, 2023

(54) DISPLAY DEVICE INCLUDING BACK COVER DISPOSED ROLLER

(71) Applicant: LG Display Co., Ltd., Seoul (KR)

(72) Inventors: JiHun Song, Seoul (KR); Hoiyong Kwon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 248 days.

(21) Appl. No.: 17/091,991

(22) Filed: Nov. 6, 2020

(65) Prior Publication Data

US 2021/0150946 A1 May 20, 2021

(30) Foreign Application Priority Data

Nov. 15, 2019 (KR) .......................... 10-2019-0146637

(51) Int. Cl.
| | |
|---|---|
| *H01L 51/52* | (2006.01) |
| *H01L 51/00* | (2006.01) |
| *G02F 1/133* | (2006.01) |
| *G09F 9/30* | (2006.01) |
| *G02F 1/1335* | (2006.01) |

(52) U.S. Cl.
CPC .......... *G09F 9/301* (2013.01); *H01L 51/5246* (2013.01); *H01L 51/5293* (2013.01); *G02F 1/133528* (2013.01); *H01L 2251/5338* (2013.01)

(58) Field of Classification Search
CPC ............. H01L 51/5246; H01L 51/5293; H01L 51/0097; H01L 51/5253; H01L 2251/5338; G02F 1/133305; G02F 1/133528; G06F 1/1641; G06F 1/1652; G06F 2203/04102; G09F 9/301
See application file for complete search history.

(56) References Cited

U.S. PATENT DOCUMENTS

| | | | |
|---|---|---|---|
| 2004/0183958 A1* | 9/2004 | Akiyama | .................. G09F 9/30 349/58 |
| 2007/0139571 A1 | 6/2007 | Kimura | |

(Continued)

FOREIGN PATENT DOCUMENTS

| | | |
|---|---|---|
| CN | 109712529 A | 5/2019 |
| CN | 110010013 A | 7/2019 |

(Continued)

OTHER PUBLICATIONS

Chinese Office Action dated Jun. 27, 2022 issued in Patent Application No. 202011216233.7 w/English Translation (15 pages).

*Primary Examiner* — Ida M Soward
(74) *Attorney, Agent, or Firm* — POLSINELLI PC

(57) ABSTRACT

A display device includes a display panel; a back cover supporting the display panel on a rear surface of the display panel; a roller disposed on a rear surface of the back cover, wherein the display panel and the back cover are wound around or unwound from the roller; a flexible film electrically connected to a pad area of the display panel; and a sealing layer disposed to cover an end of the flexible film. At least some of elements of the display panel including a substrate may be extended beyond the sealing layer. Accordingly, it is possible to prevent cracks in the display panel due to the pressing by the cover plate and the overflow of the sealant, thereby solving the issues of driving failure and reliability of the display panel.

20 Claims, 11 Drawing Sheets

(56) References Cited

U.S. PATENT DOCUMENTS

| | | | |
|---|---|---|---|
| 2008/0212271 A1* | 9/2008 | Misawa | G09F 9/35 361/679.01 |
| 2015/0002398 A1* | 1/2015 | Nakhimov | G06F 1/1652 345/173 |
| 2015/0340004 A1* | 11/2015 | Pang | G09G 5/00 345/205 |
| 2017/0263886 A1 | 9/2017 | Oh et al. | |
| 2017/0318689 A1* | 11/2017 | Kim | G09F 9/301 |
| 2017/0367198 A1* | 12/2017 | Park | H04M 1/0268 |
| 2019/0172377 A1* | 6/2019 | Kim | G09F 9/301 |
| 2019/0198783 A1* | 6/2019 | Kim | G06F 1/1652 |
| 2020/0013317 A1* | 1/2020 | Cho | H05K 5/0017 |
| 2020/0093011 A1* | 3/2020 | Lee | G06F 1/1652 |
| 2020/0100371 A1* | 3/2020 | Choi | G02F 1/133305 |
| 2020/0154580 A1* | 5/2020 | Shin | G02F 1/133305 |
| 2020/0160760 A1* | 5/2020 | Park | H04R 9/066 |
| 2020/0170114 A1* | 5/2020 | Choi | H05K 5/0217 |
| 2021/0135492 A1* | 5/2021 | Kim | H05K 5/0017 |
| 2021/0240294 A1* | 8/2021 | Ko | G06F 3/0416 |
| 2021/0335153 A1* | 10/2021 | Zhang | G09F 9/301 |

FOREIGN PATENT DOCUMENTS

| | | |
|---|---|---|
| CN | 110061037 A | 7/2019 |
| JP | 2006147912 A | 6/2006 |
| JP | 2009093158 A | 4/2009 |
| KR | 10-2017-0138592 A | 12/2017 |

* cited by examiner

DISPLAY DEVICE INCLUDING BACK COVER DISPOSED ROLLER

CROSS-REFERENCE TO RELATED APPLICATION

This application claims the priority to Korean Patent Application No. 10-2019-0146637 filed on Nov. 15, 2019, which is hereby incorporated by reference in its entirety.

BACKGROUND

Field of the Disclosure

The present disclosure relates to a display device, and more particularly to a rollable display device that can display images even when it is rolled.

Description of the Background

Display devices employed by the monitor of a computer, a TV, a mobile phone or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

In addition, a rollable display device is attracting attention as the next generation display device. Such a rollable display device is fabricated by forming display elements and lines on a flexible substrate made of a flexible material such as plastic so that it is able to display images even if it is rolled.

SUMMARY

Accordingly, the present disclosure is to provide a rollable display device employing a polyimide (PI) substrate that can prevent cracks in a display panel which may occur when the display panel is pressed by a cover plate while the display device is wound around a roller.

The present disclosure is also to provide a display device that can prevent cracks in the display panel which may occur when a sealant overflows while glass under the polyimide (PI) substrate is removed.

The present disclosure is not limited to the above-mentioned objects, and other objects, which are not mentioned above, can be clearly understood by those skilled in the art from the following descriptions.

According to an aspect of the present disclosure, there is provided a display device including: a display panel; a back cover supporting the display panel on a rear surface of the display panel; a roller disposed on a rear surface of the back cover, wherein the display panel and the back cover are wound around or unwound from the roller; a flexible film electrically connected to a pad area of the display panel; and a sealing layer disposed to cover an end of the flexible film. At least some of elements of the display panel including a substrate may be extended beyond the sealing layer.

Other detailed matters of the exemplary aspects are included in the detailed description and the drawings.

According to an exemplary aspect of the present disclosure, an end of a display panel is extended to form a buffer zone outside a sealing layer, and a cover plate is moved to the buffer zone. As a result, it is possible to prevent cracks in the display panel which may occur due to pressing by the cover plate and overflow of a sealant.

In this manner, it is possible to solve issues of driving failure and reliability of a display panel.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain various principles.

In the drawings.

DETAILED DESCRIPTION

Figure 1A:
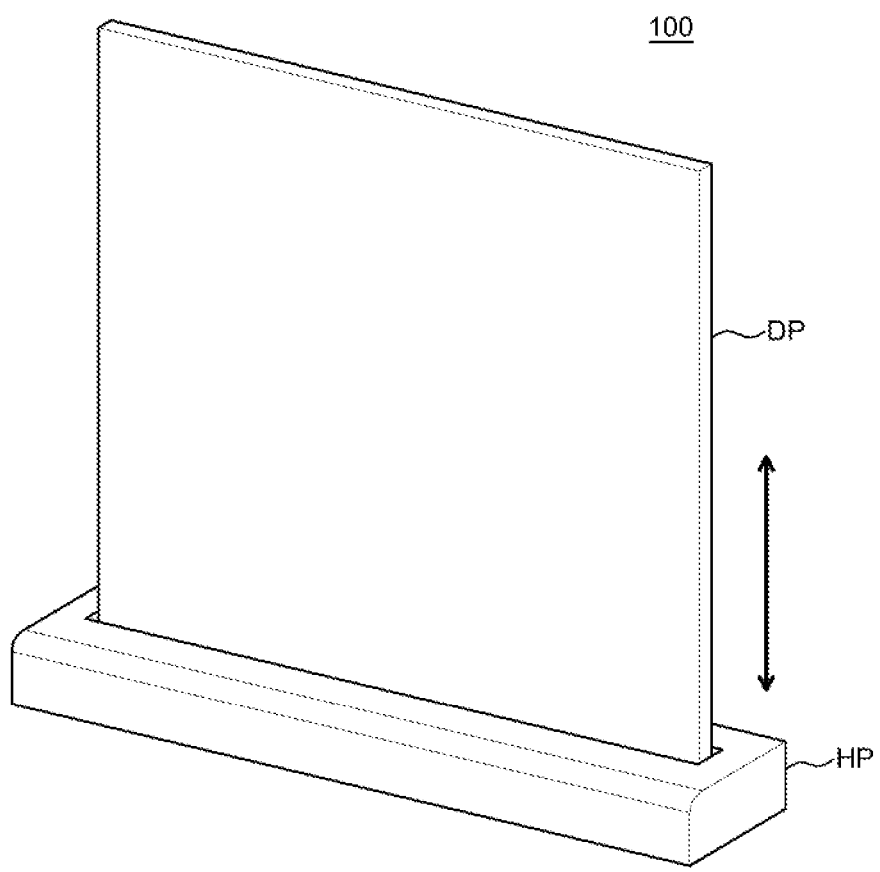
FIGS. 1A and 1B are perspective views of a display device according to a first exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

A rollable display device may be referred to as a display device capable of displaying images even when it is rolled. A rollable display device may have higher flexibility than existing typical display devices. Depending on whether a rollable display device is in use or not, the shape of the rollable display device may be changed as desired. Specifically, when the rollable display device is not used, the rollable display device may be rolled to reduce the volume for storage. On the other hand, when the rollable display device is used, the rolled rollable display device may be unfolded for use.

Figure 1B:
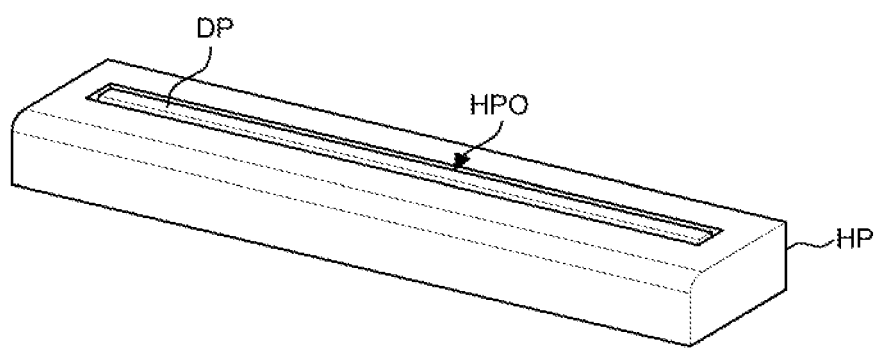

FIGS. 1A and 1B are perspective views of a display device according to a first exemplary aspect of the present disclosure. Referring to FIGS. 1A and 1B, a display device 100 according to the first exemplary aspect of the present disclosure may include a display part DP and a housing part HP.

The display part DP is an element for displaying images to a user. For example, a display element, circuitry for driving the display element, lines and components may be disposed in the display part DP.

Since the display device 100 according to the first exemplary aspect of the present disclosure is a rollable display device, the display part DP may be able to be wound or unwound. The display part DP may be formed of a display panel and a back cover having flexibility to be able to be wound or unwound. The display part DP will be described in more detail later with reference to FIGS. 4 to 7.

The housing part HP is a case in which the display part DP can be accommodated. The display part DP may be wound and accommodated inside the housing part HP, and the display part DP may be unwound and disposed outside the housing part HP.

The housing part HP has an opening HPO so that the display part DP can move inside and outside the housing part HP. The display part DP may move in the vertical direction through the opening HPO of the housing part HP.

In addition, the display part DP may be switched between a full-unwinding state and a full-winding state.

FIG. 1A shows the fully-unwinding state of the display part DP of the display device 100, in which the display part DP of the display device 100 is disposed outside the housing part HP. That is to say, in order for a user to watch images on the display device 100, the display part DP is fully unwound until it can no longer be unwound and disposed outside the housing part HP.

FIG. 1B shows the fully-winding state of the display part DP of the display device 100, in which the display part DP of the display device 100 is disposed inside the housing part HP until it can no longer be wound. That is to say, when the user does not watch images on the display device 100, it is advantageous in terms of appearance that the display part DP is not disposed outside the housing part HP. Therefore, the display part DP is wound and is accommodated inside the housing part HP, which may be defined as the fully wound state. In addition, when the display part DP is in the fully-wing state where it is accommodated in the housing part HP, the volume of the display device 100 can be reduced and thus it is easier to carry.

A driver is disposed for winding or unwinding the display part DP to switch between the fully-unwinding state and the fully-winding state.

Figure 2:
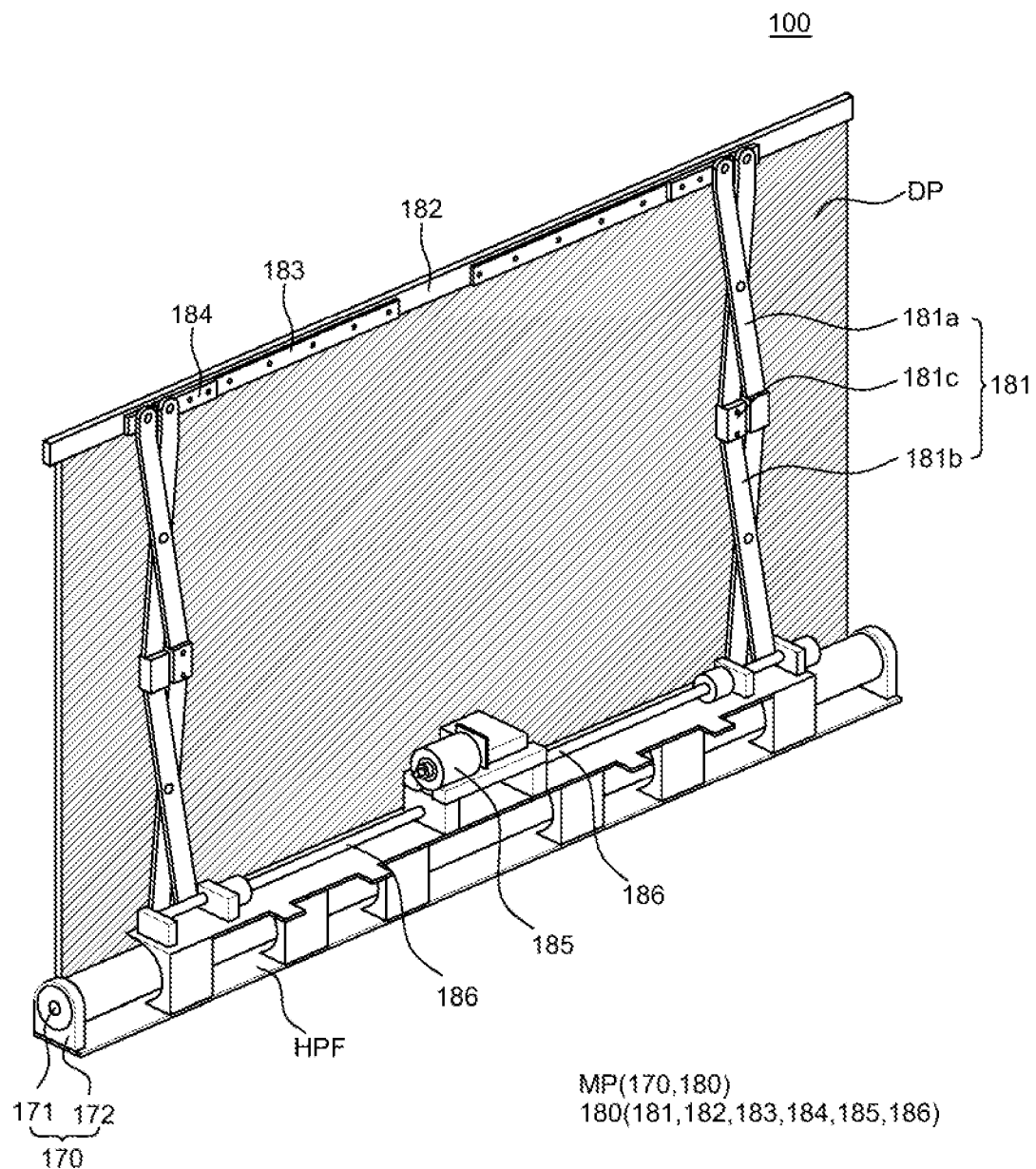
FIG. 2 is a perspective view of the display device according to the first exemplary aspect of the present disclosure.

FIG. 2 is a perspective view of the display device according to the first exemplary aspect of the present disclosure.

Figure 3:
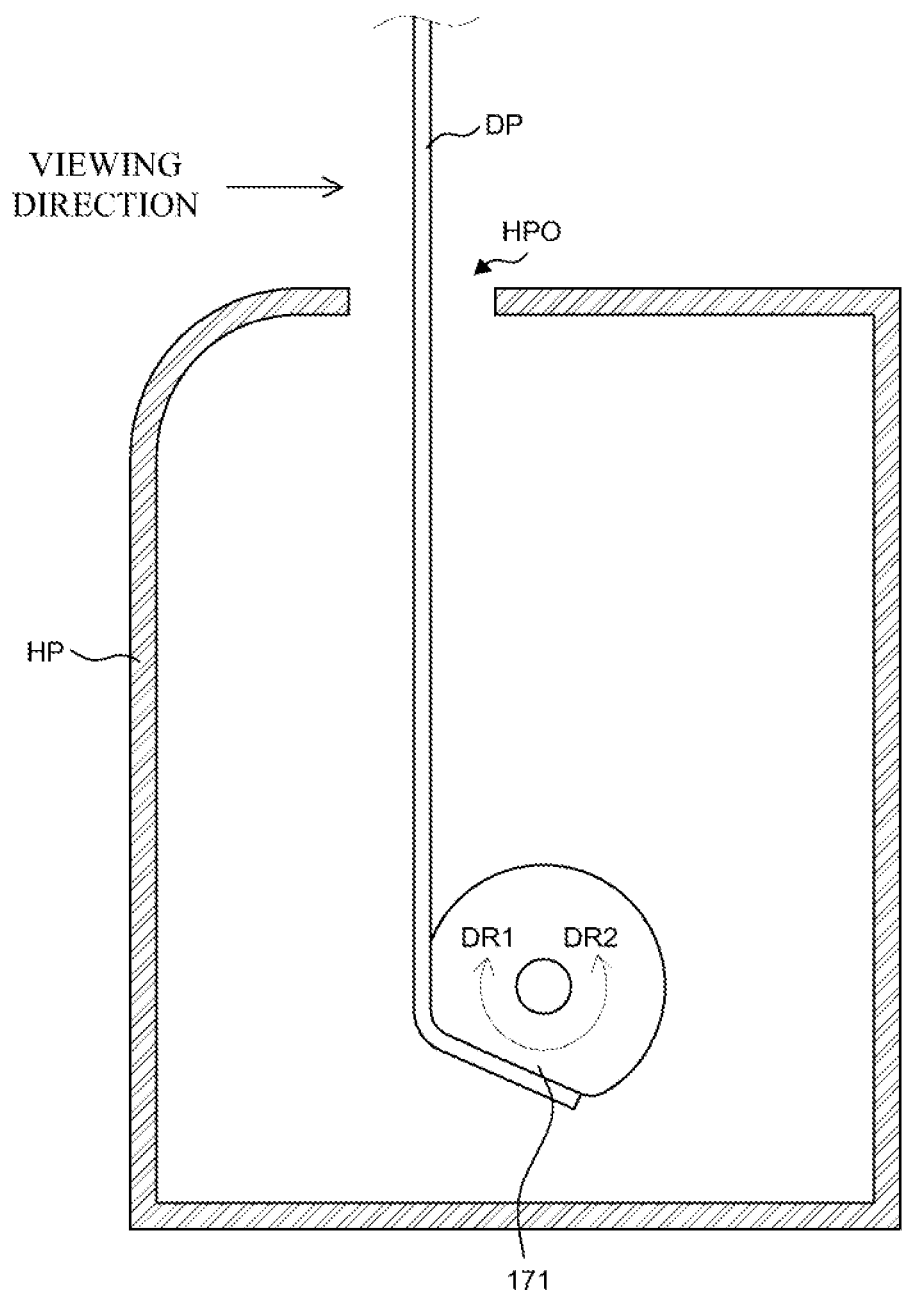
FIG. 3 is a schematic cross-sectional view of the display device according to the first exemplary aspect of the present disclosure.

FIG. 3 is a schematic cross-sectional view of the display device according to the first exemplary aspect of the present disclosure.

FIG. 3 is a schematic cross-sectional view for illustrating a roller 171 and a display part DP of the display device 100 according to the first exemplary aspect of the present disclosure. Accordingly, for convenience of illustration, FIG. shows only the housing part HP, the roller 171 and the display part DP.

Referring to FIG. 2, the driver MP may include a roller unit 170 and an elevation mechanism 180.

The roller unit 170 may rotate clockwise or counterclockwise while the display part DP fixed to the roller unit 170 may be wound around or unwound from it. The roller unit 170 may include a roller 171 and roller supports 172.

The roller 171 is a member around which the display part DP is wound. The roller 171 may be formed in a cylindrical shape, for example. The lower edge of the display part DP may be fixed to the roller 171. When the roller 171 rotates, the display part DP having its lower edge fixed to the roller 171 may be wound around the roller 171. When the roller 171 rotates in the opposite direction, the display part DP wound around the roller 171 may be unwound from the roller 171.

Referring to FIG. 3, the roller 171 may be formed in a cylindrical shape. A part of the outer circumferential surface of the cylindrical shape may be formed as a flat surface, and the rest part of the outer circumferential surface of the cylindrical shape may be formed as a curved surface. The roller 171 may be formed generally in a cylindrical shape, with a part of it formed as a flat surface. That is to say, a part of the outer circumferential surface of the roller 171 may be formed flat while the rest part of the outer circumferential surface thereof may be formed curved.

It is, however, to be noted that the roller 171 may be formed in a complete cylindrical shape or in any shape as long as the display part DP can be wound around it.

Referring back to FIG. 2, the roller supports 172 may support the roller 171 on both sides of the roller 171. Specifically, the roller supports 172 are disposed on the floor HPF of the housing part HP, and the upper side surface of the roller supports 172 may be combined with both ends of the roller 171, respectively. Thus, the roller supports 172 may support the roller 171 so that they are spaced apart from the floor HPF of the housing part HP. The roller 171 may be coupled to the roller supports 172 so that it can rotate.

The elevation mechanism 180 may move the display part DP in the vertical direction in accordance with the driving of the roller unit 170. The elevation mechanism 180 may include link units 181, a head bar 182, slide rails 183, sliders 184, a motor 185, and rotors 186.

Each of the link units 181 of the elevation mechanism 180 may include a plurality of links 181a and 181b and a hinge 181c connecting between the links 181a and 181b. Specifically, the plurality of link 181a and 181b may include a first link 181a and a second link 181b, and the first link 181a and the second link 181b cross each other in a scissor shape and are rotatably connected via the hinge 181c. Accordingly, when the link unit 181 moves in the vertical direction, the links 181a and 181b may rotate in a direction that is moved away from or closer to each other.

The head bar 182 of the elevation mechanism 180 may be fixed to the top end of the display part DP. The head bar 182 may be connected to the link unit 181 and may move the display part DP in the vertical direction according to the rotation of the plurality of links 181a and 181b of the link unit 181. In other words, the display part DP may be moved in the vertical direction by the head bar 182 and the link unit 181.

The head bar 182 covers only a part of the surface adjacent to the top edge of the display part DP so as not to hide the images displayed on front face of the display part DP. The display part DP and the head bar 182 may be fixed with, but is not limited to, screws.

The slide rails 183 of the elevation mechanism 180 may provide movement paths of the plurality of links 181a and 181b. A part of the links 181a and 181b is rotatably fastened to the slide rails 183, so that movement can be guided along the trajectory of the slide rails 183. A part of the links 181a and 181b may be fastened to the sliders 184 that are movable along the slide rails 183, so that they can move along the trajectory of the slide rails 183.

The motor 185 may be connected to a power generator such as a separate external power supply or a built-in battery to receive power. The motor 185 may generate a rotational force to provide a driving force to the rotors 186.

The rotors 186 are connected to the motor 185 and are configured to convert rotational motion from the motor 185 into linear reciprocating motion. That is to say, the rotational motion of the motor 185 can be converted into a linear reciprocating motion of the structure fixed to the rotors 186. For example, the rotors 186 may be implemented as, but is not limited to, a shaft and a ball screw including a nut fastened to the shaft.

The motor 185 and the rotors 186 may be interlocked with the link units 181 to elevate the display part DP. The link units 181 are formed in a link structure and receive the driving force from the motor 185 and the rotors 186 to repeatedly perform folding or unfolding operations.

When the display part DP is wound, the motor 185 is driven, and accordingly the structure of the rotors 186 may perform a linear motion. That is to say, a part of the rotors 186 to which one end of the second link 181b is connected may perform linear motion. As a result, one end of the second link 181b may move toward the motor 185, and the plurality of links 181a and 181b may be folded, so that the height of the link units 181 may be reduced. In addition, in the course that the links 181a and 181b are folded, the head bar 182 connected to the first link 181a also descends, and one end of the display part DP connected to the head bar 182 also descends.

When the display part DP is unwound, the motor 185 is driven, and accordingly the structure of the rotors 186 may perform a linear motion. That is to say, a part of the rotors 186 to which one end of the second link 181b is connected may perform linear motion. Accordingly, one end of the second link 181b may move away from the motor 185, and the plurality of links 181a and 181b may be unfolded, so that the height of the link units 181 may be increased. In addition, in the course that the links 181a and 181b are unfolded, the head bar 182 connected to the first link 181a also ascends, and one end of the display part DP connected to the head bar 182 also ascends.

Accordingly, when the display part DP is fully wound around the roller 171, the link units 181 of the elevation mechanism 180 may remain folded. That is to say, when the display part DP is fully wound around the roller 171, the elevation mechanism 180 may have the lowest height. When the display part DP is fully unwound, the link units 181 of the elevation mechanism 180 may remain unfolded. That is to say, when the display unit DP is fully unwound, the elevation mechanism 180 may have the highest height.

When the display part DP is wound, the roller 171 may rotate and the display part DP may be wound around the roller 171. Referring to FIG. 3 as an example, the lower edge of the display part DP may be connected to the roller 171. When the roller 171 rotates in a second direction DR2, i.e., counterclockwise, the rear surface of the display part DP may be in tight contact with the surface of the roller 171 so that the display part DP can be wound around it.

On the other hand, when the display part DP is unwound, the roller 171 may rotate and the display part DP may be unwound from the roller 171. For example, referring to FIG. 3, when the roller 171 rotates in the first direction DR1, i.e., clockwise, the display part DP wound around the roller 171 may be unwound from the roller 171 and may be disposed outside the housing part HP.

In some other exemplary aspects, the driver MP having other structure than that of the above-described driver MP may be employed by the display device 100. The configurations of the roller unit 170 and the elevation mechanism 180 may be altered, some of the configurations may be omitted or other configurations may be added, as long as the display part DP can be wound and unwound.

Figure 4:
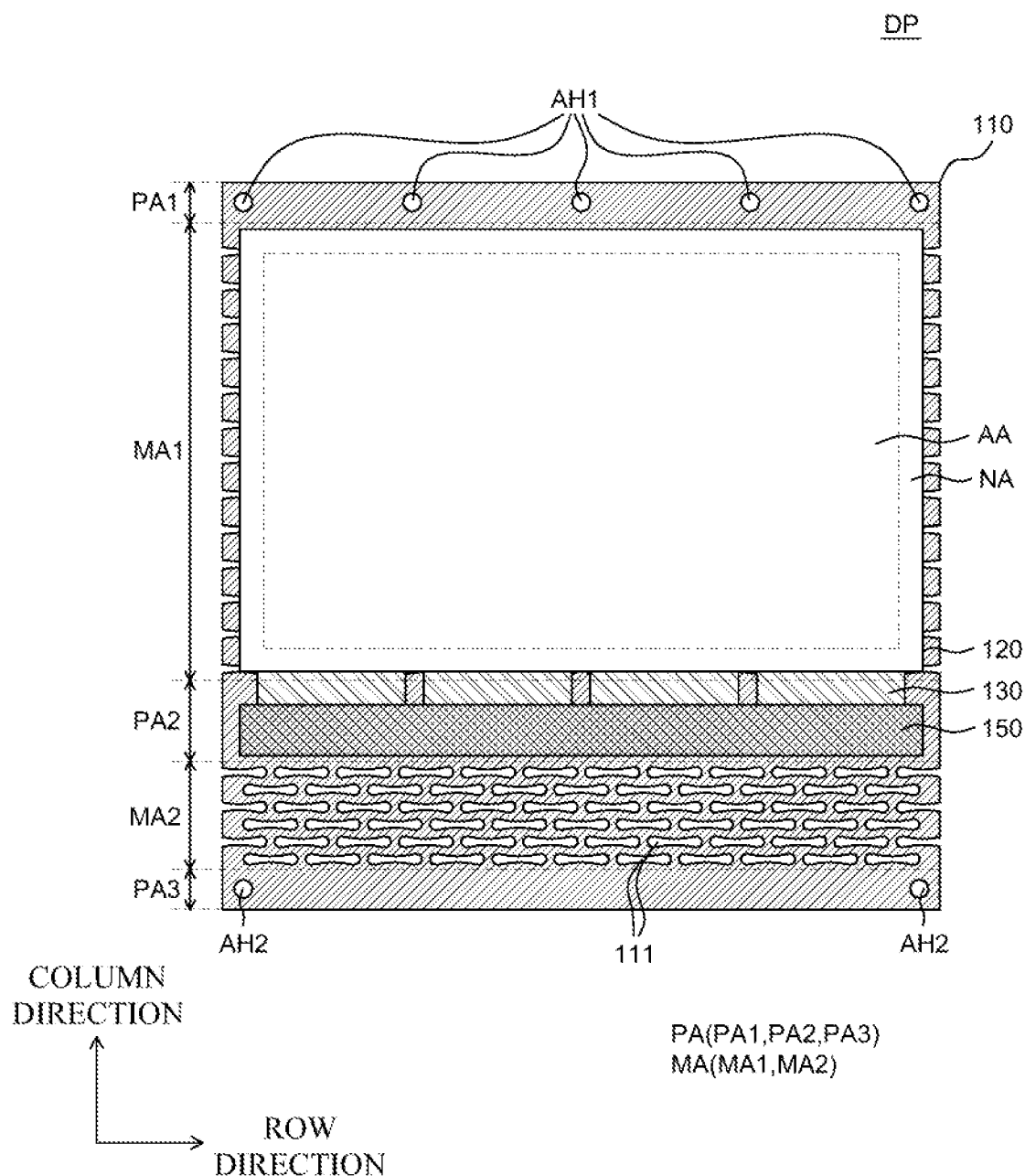
FIG. 4 is a plan view of a display part of the display device according to the first exemplary aspect of the present disclosure.

FIG. 4 is a plan view of a display part of the display device according to the first exemplary aspect of the present disclosure.

Figure 5:
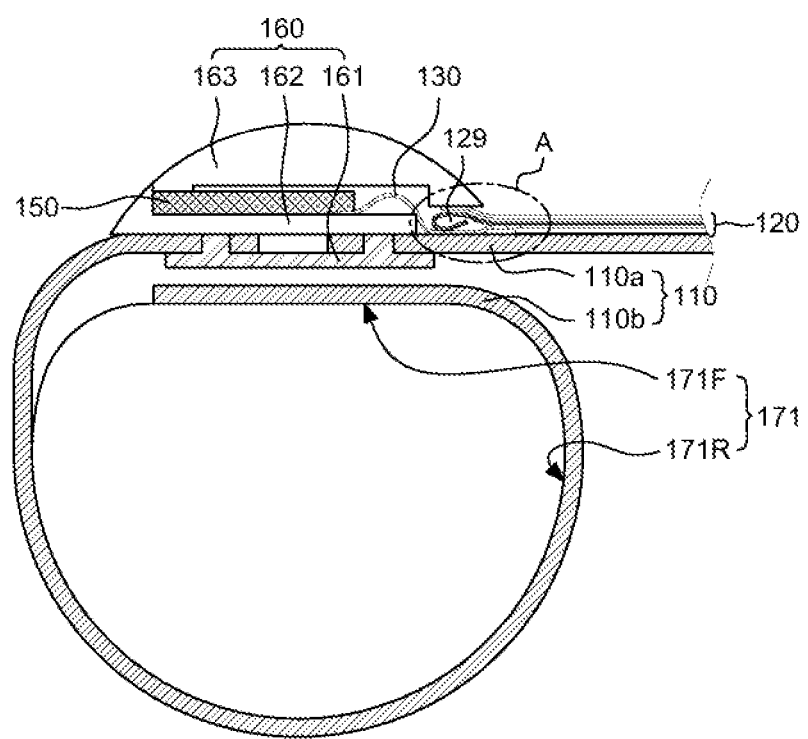
FIG. 5 is a cross-sectional view showing a part of a display device according to the first exemplary aspect of the present disclosure.

FIG. 5 is a cross-sectional view showing a part of a display device according to the first exemplary aspect of the present disclosure.

Figure 6:
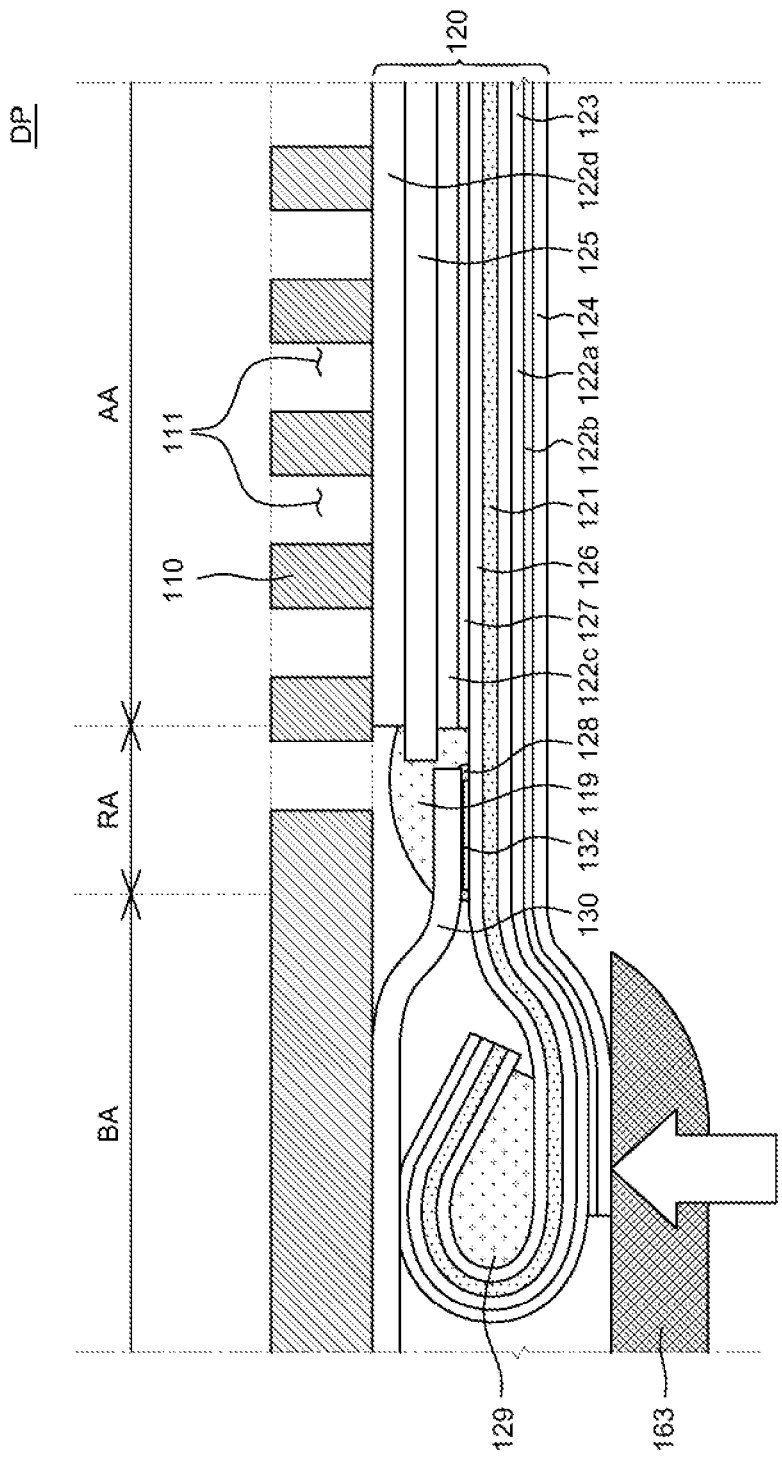
FIG. 6 is an enlarged view showing portion A of FIG. 5.

FIG. 6 is an enlarged view showing portion A of FIG. 5.

Figure 7:
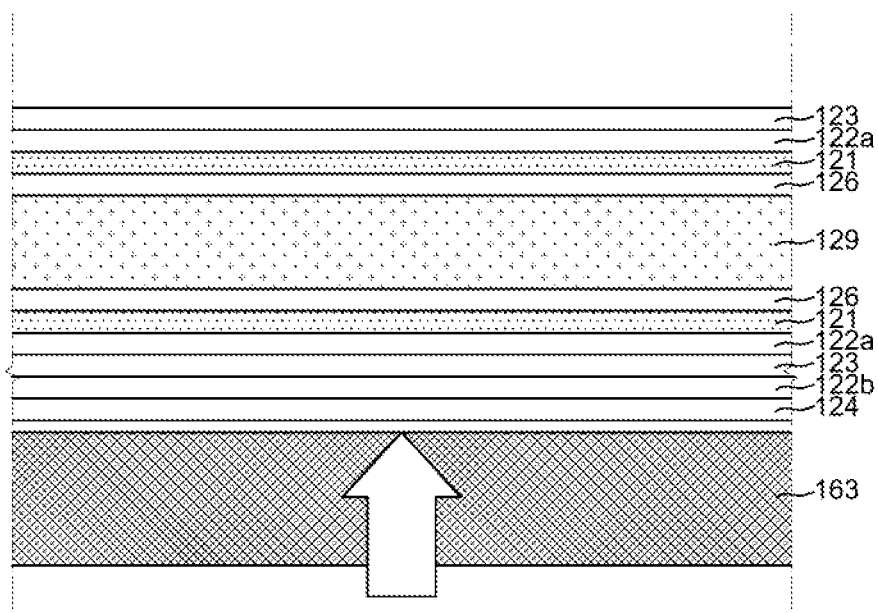
FIG. 7 is a view showing a cross-sectional structure of the buffer zone of FIG. 6.

FIG. 7 is a view showing a cross-sectional structure of the buffer zone of FIG. 6.

FIG. 4 is a plan view showing the display part DP viewed from the front. Although the printed circuit board 150 is disposed on the front side of the display part DP in the example shown in FIG. 4, the present disclosure is not limited thereto. Although FIG. 4 shows an example where the back cover 110 is formed as a single piece, the present disclosure is not limited thereto. The back cover 110 may be divided into a first back cover 110a and a second back cover 110b, as shown in FIG. 5.

FIG. 5 shows an example where the roller 171 is fastened to the display part DP.

Referring to FIGS. 4 to 7, the display part DP may include a back cover 110, the display panel 120, a flexible film 130, and the printed circuit board 150.

Referring to FIG. 4, the back cover 110 may be disposed on the rear surface of the display panel 120 to support the display panel 120, a plurality of flexible films 130 and the printed circuit board 150. The back cover 110 may be larger than the display panel 120. The back cover 110 can protect other elements of the display part DP from the outside.

Although the back cover 110 is made of a material having rigidity, at least a part of the back cover 110 may have flexibility so that it can be wound around or unwound from the roller together with the display panel 120. For example, the back cover 110 may be made of a metal material such as steel use stainless (SUS) and Invar, or a material such as plastic. It is to be noted that the material of the back cover 110 may be changed as long as the material satisfies the physical property conditions such as the amount of thermal deformation, the radius of curvature and the strength depending on the design choice.

The back cover 110 may include a plurality of supporting areas PA and a plurality of flexible areas MA. In the plurality of supporting areas PA, no opening 111 is formed. In the plurality of flexible areas MA, a plurality of openings 111 is formed. Specifically, a first supporting area PA1, a first flexible area MA1, a second supporting area PA2, a second flexible area MA2, and a third supporting area PA3 may be disposed in this order from the top end of the back cover 110. It is, however, to be understood that the present disclosure is not limited thereto. Since the back cover 110 is wound or unwound in the column direction, the plurality of supporting areas PA and the plurality of flexible areas MA may be arranged along the column direction.

The first supporting area PA1 is the uppermost area of the back cover 110 and is fastened to the head bar 182. First fastening holes AH1 may be formed in the first supporting area PA1 for fastening to the head bar 182. For example, the head bar 182 may be fastened to the first supporting area PA1 of the back cover 110 through screws penetrating the head bar 182 and the first fastening holes AH1. As the first supporting area PA1 is fastened to the head bar 182, when the link units 181 fastened to the head bar 182 are elevated or lowered, the back cover 110 may also be elevated or lowered together. In addition, the display panel 120 attached to the back cover 110 may also be elevated or lowered together. Although the five first fastening holes AH1 are shown in FIG. 4, the number of the first fastening holes AH1 is not limited to five. In addition, although the back cover 110 is fastened to the head bar 182 using the first fastening holes AH1 in the example shown in FIG. 4, the present disclosure is not limited thereto. The back cover 110 and the head bar 182 may be fastened without a separate fastening hole.

The first flexible area MA1 is extended from the first supporting area PA1 toward the lower side of the back cover 110. In the first flexible area MA1, a plurality of openings 111 may be formed and the display panel 120 may be attached. Specifically, the first flexible area MA1 may be wound around or unwound from the roller 171 together with the display panel 120. The first flexible area MA1 may overlap at least the display panel 120 among the other elements of the display part DP.

In addition, the second supporting area PA2 is extended from the first flexible area MA1 toward the lower side of the back cover 110. In the second supporting area PA2, one end of the display panel 120 and a plurality of flexible films 130 connected to the end of the display panel 120 may be disposed. Although FIG. 4 shows an example where a plurality of flexible films 130 and the printed circuit board 150 are disposed on the upper surface of the second supporting area PA2, the present disclosure is not limited thereto. The printed circuit board 150 may be disposed on the rear surface of the back cover 110.

In order to protect the plurality of flexible films 130 and the printed circuit board 150, the second supporting area PA2 may allow the flexible films 130 and the printed circuit board 150 to remain flat without being bent over the roller 171.

In addition, when the second supporting area PA2 is wound around the roller 171, a portion of the outer circumferential surface of the roller 171 in contact with the second supporting area PA2 may also be made flat. Accordingly, the second supporting area PA2 may be wound around the roller 171 or may remain flat all the time irrespectively of whether the display device is unwound, and thus the flexible films 130 and the printed circuit board 150 disposed in the second supporting area PA2 can also remain flat. As described above, the back cover 110 may be divided into the first back cover 110a and the second back cover 110b, as shown in FIG. 5. It is, however, to be understood that the present disclosure is not limited thereto. The first back cover 110a may include the first supporting area PA1, the first flexible area MA1, and a part of the second supporting area PA2. The second back cover 110b may include another part of the second support PA2, the second flexible area MA2 and the third supporting area PA3.

Referring to FIG. 4, the second flexible area MA2 is extended from the second supporting area PA2 toward the lower side of the back cover 110. In the second flexible area MA2, a plurality of openings 111 is formed. The second flexible area MA2 is extended so that the display area AA of the display panel 120 can be disposed outside the housing part HP. That is to say, for example, when the back cover 110 and the display panel 120 are fully unwound, the third supporting area PA3 fixed to the roller 171, the second flexible area MA2 and the second supporting area PA2 where the flexible films 130 and the printed circuit board 150 are disposed may be located inside the housing part HP. In addition, the first flexible area MA1 to which the display panel 120 is attached may be located outside the housing part HP. In other words, when the display panel 120 is fully unwounded, the third supporting area PA3 fixed to the roller 171, the second flexible area MA2 and the second supporting area PA2 may be located inside the housing part HP.

If the length from the third supporting area PA3 to the second supporting area PA2 is smaller than the length from the supporting area PA3 to the opening HPO of the housing part HP, a part of the first flexible area MA1 having the display panel 120 attached thereto may be located inside the housing part HP and accordingly a part of the lower end of the display area AA of the display panel 120 may be located inside the housing part HP. As a result, a part of images displayed on the display panel 120 may not be seen. Therefore, the display device may be designed so that the length from the third supporting area PA3 fixed to the roller 171 to the second supporting area PA2 is equal to the length from the third supporting area PA3 fixed to the roller 171 to the opening HPO of the housing part HP. However, it is merely illustrative.

In addition, the third supporting area PA3 is extended from the second flexible area MA2 toward the lower side of the back cover 110. The third supporting area PA3 is the lowermost area of the back cover 110 and is fastened to the roller 171. Second fastening holes AH2 may be formed in the third supporting area PA3 for fastening to the roller 171. For example, the screws penetrating the roller 171 and the second fastening holes AH2 are disposed, so that the roller 171 and the third supporting area A3 of the back cover 110 can be fastened. As the third supporting area PA3 is fastened to the roller 171, the back cover 110 may be wound around or unwound from the roller 171. Although the two second fastening holes AH2 are shown in FIG. 4, the number of the second fastening holes AH2 is not limited to two.

It is to be noted that the plurality of openings 111 formed in the plurality of flexible areas MA is not formed in the first supporting area PA1, the second supporting area PA2, and the third supporting area PA3. Specifically, the first fastening holes AH1 are formed in the first supporting area PA1 and the second fastening holes AH2 area formed in the third supporting area PA3, but the openings 111 like those formed in the flexible areas MA are not formed in the first supporting area PA1, the second supporting area PA2 and the third supporting area PA3. In addition, the first fastening holes AH1 and the second fastening holes AH2 have a different shape from the shape of the plurality of openings 111. The first supporting area PA1 may be fixed to the head bar 182. The second supporting area PA2 may support a plurality of flexible films 130 and the printed circuit board 150. The third supporting area PA3 may be fixed to the roller 171 and may be more rigid than the plurality of flexible areas MA.

As the first supporting area PA1, the second supporting area PA2 and the third supporting area PA3 have rigidity, the first supporting area PA1 and the third supporting area PA3 may be firmly fixed to the head bar 182 and the roller 171. In addition, the second supporting area PA2 keeps the plurality of flexible films 130 and the printed circuit board 150 flat without being bent, so that the flexible films 130 and the printed circuit board 150 can be protected. Therefore, the display part DP is fixed to the roller 171 and the head bar 182 of the driver MP, and thus it may move into or out of the housing part HP according to the operation of the driver MP, so that the flexible films 130 and the printed circuit board 150 can be protected.

Although the plurality of supporting areas PA and the plurality of flexible areas MA of the back cover 110 are sequentially arranged along the column direction in the example shown in FIG. 4, the plurality of supporting areas PA and the plurality of flexible areas MA may be arranged along the row direction when the back cover 110 is wound in the row direction.

When the display part DP is wound or unwound, the openings 111 formed in the flexible areas MA of the back cover 110 may be deformed due to the stress applied to the display part DP. Specifically, when the display part DP is wound or unwound, the flexible areas MA of the back cover 110 may be deformed as the openings 111 contract or expand. As the openings 111 contract or expand, it is possible to suppress the display panel 120 disposed on the flexible areas MA of the back cover 110 from slipping, and the stress applied to the display panel 120 can be reduced.

Incidentally, when the display panel 120 and the back cover 110 are wound, due to the difference in the radius of curvature between the display panel 120 and the back cover 110, there is a difference in the length between the display panel 120 and the back cover 110 which are wound around the roller 171. For example, the length of the back cover 110 when it is wound around the roller 171 once may be different from the length of the display panel 120 when it is wound around the roller 171 once. Specifically, since the display panel 120 is disposed more to the outside of the roller 171 than the back cover 110, for example, the length of the display panel 120 when it is wound around once the roller 171 may be larger than the length of the back cover 110 when it is wound around once the roller 171. As such, when the display part DP is wound, there is a difference in the length between the back cover 110 and the display panel 120 wound around the roller 151 due to the difference in the radius of curvature. As a result, the display panel 120 attached to the back cover 110 may slide and deviate from the original position. As used herein, a phenomenon that the display panel 120 slips from the back cover 110 due to a difference in the radius of curvature and stress caused by winding may be defined as a slip phenomenon. If the slip is excessively large, the display panel 120 may be detached from the back cover 110, or defects such as cracks may occur.

In the display device 100 according to the first exemplary aspect of the present disclosure, even if stress is applied to the display part DP while the display part DP is wound or unwound, the plurality of openings 111 of the back cover 110 can be deformed flexibly so that the stress applied to the back cover 110 and the display panel 120 can be relieved. For example, when the back cover 110 and the display panel 120 are wound around the roller 171 in the column direction, stress may be applied which deforms the back cover 110 and the display panel 120 in the vertical direction. When this happens, the plurality of openings 111 of the back cover 110 may be expanded in the vertical direction of the back cover 110, and the length of the back cover 110 may be flexibly deformed. Accordingly, the difference in the length between the back cover 110 and the display panel 120 due to the difference in the radius of curvature in the course of winding the back cover 110 and the display panel 120 can be compensated for by the plurality of openings 111 of the back cover 110. In addition, the openings 111 are deformed when the back cover 110 and the display panel 120 are wound, so that stress applied from the back cover 110 to the display panel 120 can also be relieved.

Referring to FIGS. 4 to 7, the display panel 120 may be disposed on the upper surface of the back cover 110, specifically on the first back cover 110a. For example, the display panel 120 may be disposed in the first flexible area MA1 on the upper surface of the first back cover 110a.

The display panel 120 is a panel for displaying images to a user. In the display panel 120, a display element for displaying images, a driving element for driving the display element, lines for transmitting various signals to the display element and the driving element, etc. may be disposed.

The display element may be defined differently depending on the type of the display panel 120. For example, in the case that the display panel is the organic light-emitting display panel 120, the display device may be an organic light-emitting element including an anode, an organic light-emitting layer, and a cathode. For example, when the display panel 120 is a liquid-crystal display panel, the display element may be a liquid-crystal display element. In the following description, the display panel 120 is described as an organic light-emitting display panel. It is, however, to be understood that the display panel 120 is not limited to the organic light-emitting display panel. As the display device 100 according to the first exemplary aspect of the present disclosure is a rollable display device, the display panel 120 may be implemented as a flexible display panel in order to be wound around or unwound from the roller 171.

The display panel 120 may include a display area AA and a non-display area NA.

In the display area AA, images are displayed on the display panel 120. A plurality of sub-pixels forming each of a plurality of pixels and driver circuits for driving the sub-pixels may be disposed in the display area AA.

The plurality of sub-pixels is the minimum units forming the display area AA. A display element may be disposed in each of the plurality of sub-pixels. For example, an organic light-emitting element including an anode, an organic light-emitting layer, and a cathode may be disposed in each of the plurality of sub pixels. It is, however, to be understood that the present disclosure is not limited thereto. In addition, driving elements, lines etc. may be included in the driver circuits for driving a plurality of sub-pixels. For example, the driver circuits may be formed of, but is not limited to, thin-film transistors, storage capacitors, gate lines, data lines, etc.

In the non-display area NA, no image is displayed. In the non-display area NA, a variety of lines and circuits for driving the organic light-emitting elements in the display area AA, etc. may be disposed. For example, in the non-display area NA, link lines for transmitting signals to the sub-pixels and the driver circuits of the display area AA, or driver ICs such as a gate driver and a data driver, the flexible films 130, etc. may be disposed. It is, however, to be understood that the present disclosure is not limited thereto. A pad area may be located in the non-display area NA under the display panel 120.

As described above, the plurality of flexible film 130 may be disposed in the second supporting area PA2 of the back cover 110. The flexible films 130 may be formed by disposing a variety of elements such as the driver ICs on a flexible base film so as to transmit signals to the sub-pixels and the driver circuits in the display area AA. The flexible films 130 may be electrically connected to the display panel 120.

The ends of the flexible films 130 may be disposed in the non-display area NA of the display panel 120 to supply the supply voltage, the data voltage, etc. to the sub-pixels and the driver circuits in the display area AA.

The driver ICs such as the gate driver IC and the data driver IC may be disposed on the flexible films 130. The driver ICs are elements for processing data for displaying images and driving signals for processing the data. The driver ICs may be disposed by using the chip-on-glass (COG) technique, the chip-on-film (COF) technique, tape carrier package (TCP) technique, etc. Although the driver ICs are mounted on the plurality of flexible films 130 by using the chip-on-film (COF) technique for convenience of illustration, it is, however, to be understood that the present disclosure is not limited thereto.

In addition, a plurality of first pads 132 may be disposed in the non-display area NA.

The first pads 132 are conductive elements for transmitting various signals from the flexible film 130 to the display part DP and the driver.

The first pads 132 may transmit various signals such as a data signal, a high-level voltage, a low-level voltage and a clock signal through lines. Although the first pads 132 are formed on the buffer layer 126 in the example shown in FIG. 6, the present disclosure is not limited thereto. The first pads 132 may be formed on a variety of insulating layers that may be disposed in the non-display area NA, e.g., on an inorganic insulating layer.

The flexible films 130 may be electrically connected to the first pads 132 disposed on a substrate 121.

A conductive adhesive layer 128 may be disposed between the substrate 121 and the flexible film 130. The conductive adhesive layer 128 may fix the substrate 121 to the flexible films 130 and may electrically connect the first pads 132 on the substrate 121 with a second pad of the flexible films 130. The conductive adhesive layer 128 may be formed by dispersing conductive particles in an adhesive material, for example, and may be formed as an anisotropic conductive film (ACF). The substrate 121 and the flexible films 130 may be fixed by the adhesive material of the conductive adhesive layer 128, and the first pads 132 and the second pad may be electrically connected with each other through an electrical path formed by the conductive particles.

The printed circuit board 150 may be disposed on the rear surface of the second supporting area PA2 of the back cover 110 to be connected to the flexible films 130. The printed circuit board 150 is an element for supplying signals to the driver ICs. On the printed circuit board 150, a variety of elements for supplying various signals such as driving signals and data signals to the driver ICs may be disposed.

An additional printed circuit board connected to the printed circuit board 150 may be further disposed. For example, the printed circuit board 150 may be referred to as a source printed circuit board (S-PCB) on which the data driver is mounted, and the additional printed circuit board connected to the printed circuit board 150 may be referred to as a control printed circuit board (C-PCB) on which the timing controller and the like are mounted. For example, the additional printed circuit board may be disposed inside the roller 171, may be disposed in the housing part HP outside the roller 171, or may be disposed in contact with the printed circuit board 150.

The display part DP according to the exemplary aspect of the present disclosure may further include a cover unit 160.

The cover unit 160 may be disposed in the second supporting area PA2 of the back cover 110 to accommodate the printed circuit board 150. The printed circuit board 150, a part of the first back cover 110a and a part of the second back cover 110b may be inserted into the cover unit 160. The cover unit 160 may be disposed to cover the printed circuit board 150 to protect the printed circuit board 150.

The cover unit 160 according to the exemplary aspect of the present disclosure may include a base plate 161, a bottom plate 162 and a cover plate 163.

The base plate 161 may be disposed on the opposite surface of the back cover 110 (or the first back cover 110a and the second back cover 110b). In the following description, the back cover 110, wherever referred, is regarded as including the first back cover 110a and the second back cover 110b. The base plate 161 may be fixed to the second supporting area PA2 on the opposite side of the back cover 110 on which the display panel 120 is not disposed. The base plate 161 and the printed circuit board 150 may be disposed symmetrical with respect to the back cover 110 interposed therebetween. Accordingly, the base plate 161 may support the printed circuit board 150 together with the second supporting area PA2. For example, the base plate 161 may be made of a material having rigidity to support the second supporting area PA2 flat. It is, however, to be understood that the present disclosure is not limited thereto.

The bottom plate 162 may be disposed on the surface of the back cover 110.

The bottom plate 162 may be disposed to support the printed circuit board 150 disposed on the second supporting area PA2 of the back cover 110. The bottom plate 162 may be disposed between the printed circuit board 150 and the back cover 110. The bottom plate 162 may have a groove in which the printed circuit board 150 is seated so that the printed circuit board 150 does not fluctuate. In other words, the bottom plate 162 may have a concave portion where the printed circuit board 150 is seated. The groove may be referred to as a seating portion of the bottom plate 162 where the printed circuit board 150 is seated. Accordingly, it is possible to suppress the printed circuit board 150 disposed in the bottom plate 162 from fluctuating so that the printed circuit board 150 can be disposed stably. It is, however, to be understood that the present disclosure is not limited thereto. The bottom plate 162 may be formed flat.

The cover plate 163 may be disposed on the surface of the back cover 110.

The cover plate 163 may be disposed to cover the printed circuit board 150 disposed on the second supporting area PA2 of the back cover 110 and may have a convex shape. That is to say, one surface of the cover plate 163 may be formed as a curved surface. The cover plate 163 may be fixed to the second supporting area PA2 and the base plate 161 on the surface of the back cover 110 on which the display panel 120 and the printed circuit board 150 are disposed. The cover plate 163 may be made of, but is not limited to, a material having rigidity to protect the printed circuit board 150.

The cover unit 160 and the back cover 110 may be fixed to each other. For example, the cover unit 160 and the back cover 110 may be fixed to each other such that a plurality of fixing holes is formed in the second supporting area PA2, and projections protruding from the base plate 161 are inserted into the fixing holes, respectively. That is to say, for example, the cover unit 160 and the back cover 110 may be fixed to each other by fastening members such as screws penetrating through the base plate 161, the bottom plate 162, the cover plate 163 and the back cover 110. The fastening members such as screws may be disposed such that they do not interfere with the printed circuit board 150 in order to place the printed circuit board 150 inside the cover unit 160. It is, however, to be understood that the present disclosure is not limited thereto. The cover unit 160 and the back cover 110 may be fixed in a variety of ways.

When the display part DP is wound, the rigid cover plate 163 of the cover unit 160 is not deformed and maintains its convex shape so that it can protect the plurality of flexible films 130 and the printed circuit board 150. The convex-shaped cover plate 163 may form a generally circular shape together with a rounded portion 171R of the roller 171. For example, the base plate 161 having a flat shape and the cover plate 163 having a convex shape may form a generally D-shape. The generally D-shaped cover unit 160 may be seated on a flat portion 171F of the roller 171 to form a generally circular shape with the rounded portion 171R of the roller 171. Accordingly, the cover unit 160 and the roller 171 may form a generally circular shape, and a part of the display panel 120 wound on the cover unit 160 may be wound with a larger radius of curvature, so that the stress applied to the display panel 120 can be reduced.

The non-display area NA may surround the display area AA, as shown in FIG. 4. It is, however, to be understood that the present disclosure is not limited thereto. The non-display area NA may be defined as an area extended from the display area AA.

The display panel 120 may include the substrate 121, the buffer layer 126, a pixel portion 127, an encapsulation layer 122c and an encapsulation substrate 125.

The substrate 121 is a base member for supporting various elements of the display panel 120 and may be made of an insulating material. The substrate 121 may be made of a material having flexibility to allow the display panel 120 to be wound or unwound. For example, the substrate 121 may be made of a plastic material such as polyimide (PI).

A buffer layer 126 may be disposed on the substrate 121. The buffer layer 126 prevents diffusion of moisture and/or oxygen that has permeated from the outside of the substrate 121. The buffer layer 126 may be made of an inorganic material, and may be made up of, for example, a single layer of silicon oxide (SiOx) or silicon nitride (SiNx) or multiple layers thereof. It is, however, to be understood that the present disclosure is not limited thereto.

The pixel portion 127 is disposed on the substrate 121 and the buffer layer 126. The pixel portion 127 may include a plurality of organic light-emitting elements and circuits for driving the organic light-emitting elements. The pixel portion 127 may fall in the display area AA.

The display panel 120 may be either a top-emission display panel or a bottom-emission display panel depending on the direction in which light emitted from the organic light-emitting element exits.

In the top-emission display panel, the light emitted from the organic light-emitting element exits toward the upper side of the substrate 121 where the organic light-emitting element is formed. When the display panel 120 is the top-emission display panel, a reflective layer may be formed on under the anode to propagate the light emitted from the organic light-emitting element toward the upper side of the substrate 121, i.e., the cathode side.

In the bottom-emission display panel, the light emitted from the organic light-emitting element exits toward the lower side of the substrate 121 where the organic light-emitting element is formed. In the bottom-emission display panel, in order to propagate the light emitted from the organic light-emitting element toward the lower side of the substrate SUB 121, the anode may be made only of a transparent conductive material, and the cathode may be made of a metal material having high reflectivity.

In the following description, for convenience of illustration, the display device 100 is a bottom-emission display device. It is, however, to be understood that the present disclosure is not limited thereto.

Although not shown in the drawings, a thin-film transistor may be disposed on the pixel portion 127 above the substrate 121. The thin-film transistor may work as a driving element of the display device 100.

The thin-film transistor may include a gate electrode, an active layer, a source electrode, and a drain electrode. For example, the thin-film transistor may have a structure in which the active layer is disposed above the gate electrode and the source electrode and the drain electrode are disposed on the active layer, i.e., a bottom-gate structure in which the gate electrode is disposed at the bottom. It is, however, to be understood that the present disclosure is not limited thereto.

The gate electrode of the thin-film transistor may be disposed above the substrate 121. The gate electrode may be formed of, but is not limited to, one selected from among a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

A gate insulating layer may be disposed on the gate electrode. The gate insulating layer may be made up of a single layer of silicon nitride (SiNx) or silicon oxide (SiOx) which is an inorganic material, or multiple layers of silicon nitride (SiNx) or silicon oxide (SiOx). It is, however, to be understood that the present disclosure is not limited thereto.

The active layer may be disposed on the gate insulating layer. For example, the active layer may be formed of an oxide semiconductor or may be formed of an amorphous silicon (a-Si), a polycrystalline silicon (poly-Si), or an organic semiconductor, or the like.

The source electrode and the drain electrode may be disposed on the active layer. The source electrode and the drain electrode may be disposed spaced apart from each other on the same layer. The source electrode and the drain electrode may be formed of, but is not limited to, one selected from among a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

A planarization layer may be disposed over the thin-film transistor.

The planarization layer can protect the thin-film transistor and can provide a flat surface over the layers disposed above the substrate 121 which have different levels. The planarization layer may be formed of, but is not limited to, one of acrylic resin, epoxy resin, phenol resin, polyamide resin, polyimide resin, unsaturated polyester resin, photoresist, polyphenylene resin, polyphenylene sulfide resin, and benzocyclobutene.

An organic light-emitting element may be disposed on the planarization layer. The organic light-emitting element is a self-luminous element and may be driven by the thin-film transistor disposed in the sub-pixel. The organic light-emitting element may include an anode, an organic light-emitting layer above the anode, and a cathode above the organic light-emitting layer.

The anode may be disposed separately in each of the sub-pixels on the planarization layer. The anode may be electrically connected to the drain electrode of the thin-film transistor through a contact hole formed in the planarization layer.

When the display device 100 is of the bottom-emission type, the anode may be implemented as a transparent conductive layer made of a conductive material having a high work function. For example, the anode may be made of, but is not limited to, a transparent conductive oxide such as indium tin oxide (ITO), indium zinc oxide (IZO), indium tin zinc oxide (ITZO), zinc oxide (ZnO) and tin oxide (TO).

A bank may be disposed over the anode and the planarization layer.

The bank is an insulating layer for distinguishing adjacent sub-pixels from one another. For example, the bank may be made of an organic insulating material formed to cover the edge of the anode, and may be made of polyimide, acrylic, or benzocyclobutene (BCB)-based resin. It is, however, to be understood that the present disclosure is not limited thereto.

The organic light-emitting layer is a layer for emitting light of a particular color and may be one of a red light-emitting layer, a green light-emitting layer, a blue light-emitting layer and a white light-emitting layer. The organic light-emitting layer may be disposed between the anode and the cathode. The organic light-emitting layer may be made up of a single light-emitting layer or a stack of multiple layers that emit light of different colors. In addition to the organic light-emitting layer, organic layers such as a hole injection layer, a hole transport layer, an electron transport layer and an electron injection layer may be further included.

The cathode may be disposed on the organic light-emitting layer. Since the display device 100 is of a bottom-emission type, the cathode may be made of a metal material such as silver (Ag), copper (Cu), and magnesium-silver alloy (Mg:Ag).

The flexible films 130 may be disposed in the non-display area NA of the substrate 121. The flexible films 130 are formed by disposing various elements such as driver ICs on a flexible base film. The flexible films 130 may supply signals to the plurality of sub-pixels and the circuits in the display area AA. The flexible films 130 may be disposed at one end of the non-display area NA to supply a data signal, a high-level voltage, a low-level voltage, a clock signal, etc. to the plurality of sub-pixels and the circuits in the display area AA.

The encapsulation layer 122c may be disposed to cover the pixel portion 127.

The encapsulation layer 122c seals the organic light-emitting element of the pixel portion 127. The encapsulation layer 122c can protect the organic light-emitting element of the pixel portion 127 from the outside moisture, oxygen, impact, etc. The encapsulation layer 122c may be formed by alternately stacking a plurality of inorganic layers and a plurality of organic layers. For example, the inorganic layers may be made of an inorganic material such as silicon nitride (SiNx), silicon oxide (SiOx) and aluminum oxide (AlOx). The organic layer may be made of an epoxy-based or acrylic-based polymer. It is, however, to be understood that the present disclosure is not limited thereto.

The encapsulation substrate 125 is disposed on the encapsulation layer 122c. For example, the encapsulation substrate 125 may be disposed between the encapsulation layer 122c and the back cover 110. The encapsulation substrate 125 can protect the organic light-emitting element of the pixel portion 127 together with the encapsulation layer 122c. The encapsulation substrate 125 can protect the organic light-emitting element of the pixel portion 127 from the outside moisture, oxygen, impact, etc. For example, the encapsulation substrate 125 may be made of a material having a high modulus of approximately 200 to 900 MPa. The encapsulation substrate 125 may be made of a metal material such as aluminum (Al), nickel (Ni), chromium (Cr), an alloy of iron (Fe) and nickel, etc., which is resistant to corrosion and is easy to process into a foil or thin film. As the encapsulation substrate 125 is made of such a metal material, the ultra-thin encapsulation substrate 125 can be implemented, which is resistant to the outside impact, scratches. It is, however, to be understood that the present disclosure is not limited thereto.

An adhesive layer may be disposed between the encapsulation layer 122c and the encapsulation substrate 125. The adhesive layer may be attach between the encapsulation layer 122c and the encapsulation substrate 125. The adhesive layer may be made of a material having adhesive properties, and may be a thermally-curable or naturally-curable adhesive. For example, the adhesive layer may be made of, but is not limited to, an optical clear adhesive (OCA), a pressure sensitive adhesive (PSA), etc.

The adhesive layer may be disposed to surround the encapsulation layer 122c and the pixel portion 127. That is to say, the pixel portion 127 may be sealed by the buffer layer 126 and the encapsulation layer 122c, and the encapsulation layer 122c and the pixel portion 127 may be sealed by the buffer layer 126 and the adhesive layer. The adhesive layer may further include a hygroscopic agent. The hygroscopic agent may be hygroscopic particles and can absorb moisture and oxygen from the outside, thereby suppressing the permeation of moisture and oxygen into the pixel portion 127.

An adhesive member 122d may be disposed between the encapsulation substrate 125 and the back cover 110. The adhesive member 122d may attach the encapsulation substrate 125 to the back cover 110. The adhesive member 122d may be made of a material having adhesive properties, and may be a thermally-curable or naturally-curable adhesive. For example, the adhesive member 122d may be made of, but is not limited to, a double-sided tape, an optical clear adhesive (OCA), a pressure sensitive adhesive (PSA), etc.

Although the openings 111 of the back cover 110 are not filled with the adhesive member 122d in the example shown in FIG. 6, the openings 111 of the back cover 110 may be partially or entirely filled with the adhesive member 122d. If the inner sides of the openings 111 of the back cover 110 are filled with the adhesive member 122d, the contact area between the adhesive member 122d and the back cover 110 is increased, so that it is possible to prevent the delamination between the adhesive member 122d and the back cover 110.

A barrier film 123 may be disposed under the substrate 121.

A first adhesive layer 122a may be disposed between the barrier film 123 and the substrate 121.

The first adhesive layer 122a may be made of a material having adhesive properties, and may be a thermally-curable or naturally-curable adhesive. For example, the first adhesive layer 122a may be made of, but is not limited to, an optical clear adhesive (OCA), a pressure sensitive adhesive (PSA), etc.

A polarizing plate 124 may be disposed under the barrier film 123. The polarizing plate 124 selectively transmits light to reduce reflection of external light incident on the display panel 120. Specifically, the display panel 120 may include a variety of metal materials applied to semiconductor elements, lines, organic light-emitting elements, etc. Accordingly, external light incident on the display panel 120 may be reflected off such a metal material, and thus visibility of the display device 100 may be deteriorated due to the reflection of the external light. In this regard, by disposing the polarizing plate 124, it is possible to prevent the reflection of the external light to increase the outdoor visibility of the display device 100. In some implementations, however, the polarizing plate 124 may be eliminated.

A second adhesive layer 122b may be disposed between the barrier film 123 and the polarizing plate 124.

The second adhesive layer 122b may be made of a material having adhesive properties, and may be a thermally-curable or naturally-curable adhesive. For example, the second adhesive layer 122b may be made of, but is not limited to, an optical clear adhesive (OCA), a pressure sensitive adhesive (PSA), etc.

A sealing layer 119 may be disposed above the buffer layer 126 in the non-display area NA of the substrate 121. The sealing layer 119 may be disposed to cover one end of the flexible film 130.

The sealing layer 119 may be disposed to surround the display area AA in the non-display area NA and may be disposed to surround the pixel portion 127, the encapsulation layer 122c and the encapsulation substrate 125. As shown in FIG. 6, the sealing layer 119 may be disposed to surround the side surfaces of the pixel portion 127, the encapsulation layer 122c and the encapsulation substrate 125 in the non-display area NA. Thus, the sealing layer 119 may be formed in, but is not limited to, a square ring shape when viewed from the top.

As such, the sealing layer 119 is formed in order to prevent moisture permeation through the side portions of the display device 100 and reduce defects during subsequent processes. The sealing layer 119 may be made of a UV curable material, for example, UV-curable material added with a UV-curable oligomer such as epoxy acrylate, urethane acrylate, polyester acrylate, urethane, and silicone acrylate. It is, however, to be understood that the present disclosure is not limited thereto.

Incidentally, in the display device 100 according to the first exemplary aspect of the present disclosure, the end of the display panel 120 is extended to form a buffer zone BA outside the sealing layer 119, and the cover plate 163 is moved to the buffer zone BA. By doing so, it is possible to prevent cracks from occurring in the display panel 120 which may occur due to the pressing by the cover plate 163 and the overflow of the sealant.

A large-screen rollable display device has been developed as a next-generation display device. A rollable display device may be driven by employing the COF technique or the anisotropic conductive film (ACF) bonding technique. In addition, a rollable display device may employ a cover unit including a cover plate in order to prevent delamination of the end of the display panel during rolling. In a routing area RA of the display panel where the cover plate is in contact, there are level differences due to the COF, the ACF, the sealing layer etc. As a result, a crack may occur when the display panel is pressed by the cover plate due to the level differences. In addition, when the ACF or the sealing layer is formed in the routing area, the sealant may overflow. When this happens, a crack may occur in the display panel due to the overflow of the sealant when glass under the polyimide substrate is removed.

Figure 8:
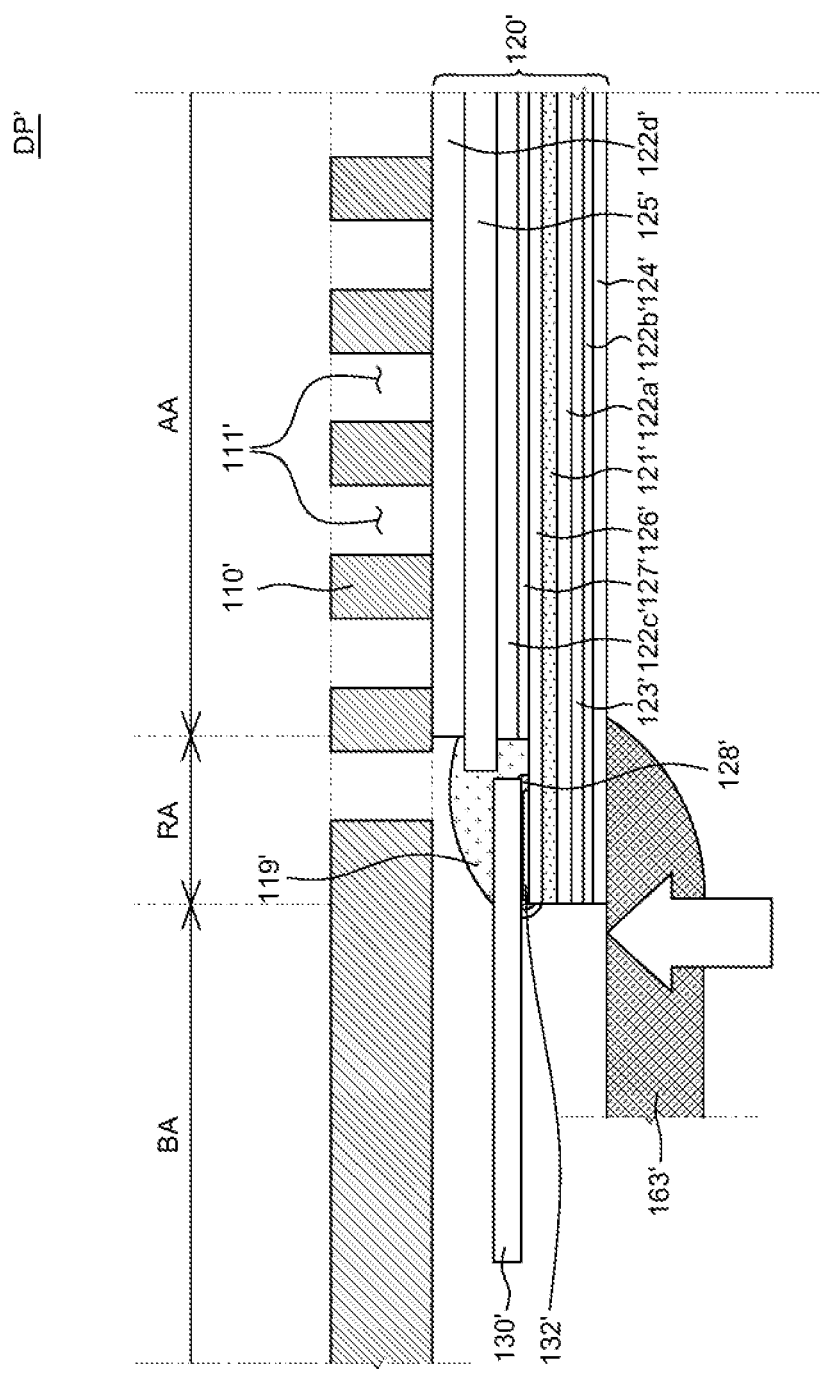
FIG. 8 is a cross-sectional view showing a part of a display device according to Comparative Example.

FIG. 8 is a cross-sectional view showing a part of a display device according to Comparative Example.

A display device according to Comparative Example shown in FIG. 8 is substantially identical to the display device according to the first exemplary aspect shown in FIG. 6 except for the structure of an end of a display panel 120'. The same reference numerals with the symbol "'" will be used to designate the identical elements.

Referring to FIG. 8, a display part DP' may include a back cover 110', a display panel 120', a flexible film 130' and a printed circuit board.

The back cover 110' may include a plurality of supporting areas and a plurality of flexible areas. In the plurality of supporting areas, no opening 111 is formed. In the plurality of flexible areas, a plurality of openings 111 is formed.

The display panel 120' may include the substrate 121', the buffer layer 126', a pixel portion 127', an encapsulation layer 122c' and an encapsulation substrate 125'.

In addition, an adhesive member 122d' may be disposed between the encapsulation substrate 125' and the back cover 110'.

A barrier film 123' may be disposed under the substrate 121'.

A first adhesive layer 122a' may be disposed between the barrier film 123' and the substrate 121'.

A polarizing plate 124' may be disposed under the barrier film 123'.

A second adhesive layer 122b' may be disposed between the barrier film 123' and the polarizing plate 124'.

A sealing layer 119' may be disposed above the buffer layer 126' in the non-display area of the substrate 121'.

The flexible films 130' may be electrically connected to first pads 132'.

A conductive adhesive layer 128' may be disposed between the substrate 121' and the flexible films 130'.

The display device according to Comparative Example employs a cover unit including a cover plate 163' in order to prevent the delamination of the end of the display panel 120' during rolling. In such a display device according to Comparative Example, there are level differences by the COF, the ACF, or the sealing layer 119' in the routing area on the upper surface of the display panel 120' where the cover plate 163' is in contact. Accordingly, a crack may occur due to the level differences when the display panel is pressed by the cover plate 163' in the direction indicated by the arrow shown in FIG. 8. In addition, when the ACF or the sealing layer 119' is formed in the routing area, the sealant may overflow. When the glass under the polyimide substrate 121' is removed, a crack may occur in the display panel 120' due to the overflow of the sealant.

That is to say, the sealant forming the sealing layer 119' is soluble and may be cured with a level difference between an area without the COF and an area with the COF during curing. In addition, it may flow down along the side surfaces of the display panel 120' and may be cured. When this happens, a crack may occur due to the level difference when the display panel is pressed by the cover plate 163' or a crack may occur in the display panel 120' due to the overflow of the sealant when the glass under the polyimide substrate 121' is removed.

In view of the above, the rollable display device 100 employing the polyimide substrate 121 can prevent cracks which may otherwise occur in the display panel 120 when it is pressed by the cover plate 163 when it is rolled. In addition, according to the exemplary aspect of the present disclosure, the display device 100 can prevent cracks in the display panel 120 due to the overflow of the sealant when the glass under the polyimide substrate 121 is removed.

To this end, referring to FIGS. 5 to 7, in the display device 100 according to the first exemplary aspect of the present disclosure, the end of the display panel 120 is extended to form the buffer zone BA outside the sealing layer 119, and the cover plate 163 is moved to the buffer zone BA. By doing so, it is possible to prevent cracks from occurring in the display panel 120 due to the pressing by the cover plate 163 and the overflow of the sealant.

To do so, in the display device 100 according to the first exemplary aspect, the elements under the pixel portion 128, e.g., the substrate 121, the buffer layer 126, the first and second adhesive layers 122a and 122b, the barrier film 123 and the polarizing plate 124 are extended from the routing area RA of the display panel 120, and thus the buffer zone BA not having the level differences due to the COF, the ACF and the sealing layer 119 is formed. In addition, the cover plate 163 for preventing delamination of the display panel 120 is moved to the buffer zone BA.

Since there is no level difference in the buffer zone BA, it is possible to prevent cracks from occurring in the display panel 120 which may occur when the display panel is pressed by the cover plate 163 and when the sealant overflows. In addition, it is possible to obtain a sufficient margin area for the ACF and the sealant thanks to the buffer zone BA, and thus the sealant does not flow down along the side surface of the display panel 120 even if it overflows.

In addition, in the display device 100 according to the first exemplary aspect, the ends of at least the substrate 121, the buffer layer 126, the first adhesive layer 122a and the barrier film 123 are further extended from the second adhesive layer 122b and the polarizing plate 124 and turn around once clockwise. The space therein is filled with a cushion layer 129. It is, however, to be understood that the present disclosure is not limited thereto. The ends of at least the substrate 121, the buffer layer 126, the first adhesive layer 122a and the barrier film 123 may be further extended from the second adhesive layer 122b and the polarizing plate 124 and may turn around once counterclockwise.

The ends of the substrate 121, the buffer layer 126, the first adhesive layer 122a and the barrier film 123 turning around the cushion layer 129 once may face the buffer layer 126.

The cushion layer 129 may have a variety of shapes such as a circular shape, a semi-circular shape and an amorphous shape in addition to the streamlined shape shown in the drawings.

The cushion layer 129 may be made of a resin, and may absorb shock when the cover plate 163 is pressed in the direction indicated by the arrow shown in FIGS. 6 and 7.

The buffer layer 126, the substrate 121, the first adhesive layer 122a and the barrier film 123 may be disposed on the cushion layer 129 from inside toward outside.

The buffer layer 126, the substrate 121, the first adhesive layer 122a and the barrier film 123 may be disposed under the cushion layer 129 from inside toward outside, and the second adhesive layer 122b and the polarizing plate 124 may be disposed under the barrier film 123. The substrate 121, the buffer layer 126, the first adhesive layer 122a and the barrier film 123 may be extended beyond the sealing layer 119.

The flexible film 130 may be in contact with and disposed on a part of the barrier film 123 which is located above the cushion layer 129.

The cover plate 163 may be in contact with and disposed under the polarizing plate 124 below the cushion layer 129.

On the other hand, as mentioned earlier, according to a second exemplary aspect of the present disclosure which will be described below, the ends of the substrate, the buffer layer, the first adhesive layer and the barrier film may be further extended than the second adhesive layer and may turn around counterclockwise.

Figure 9:
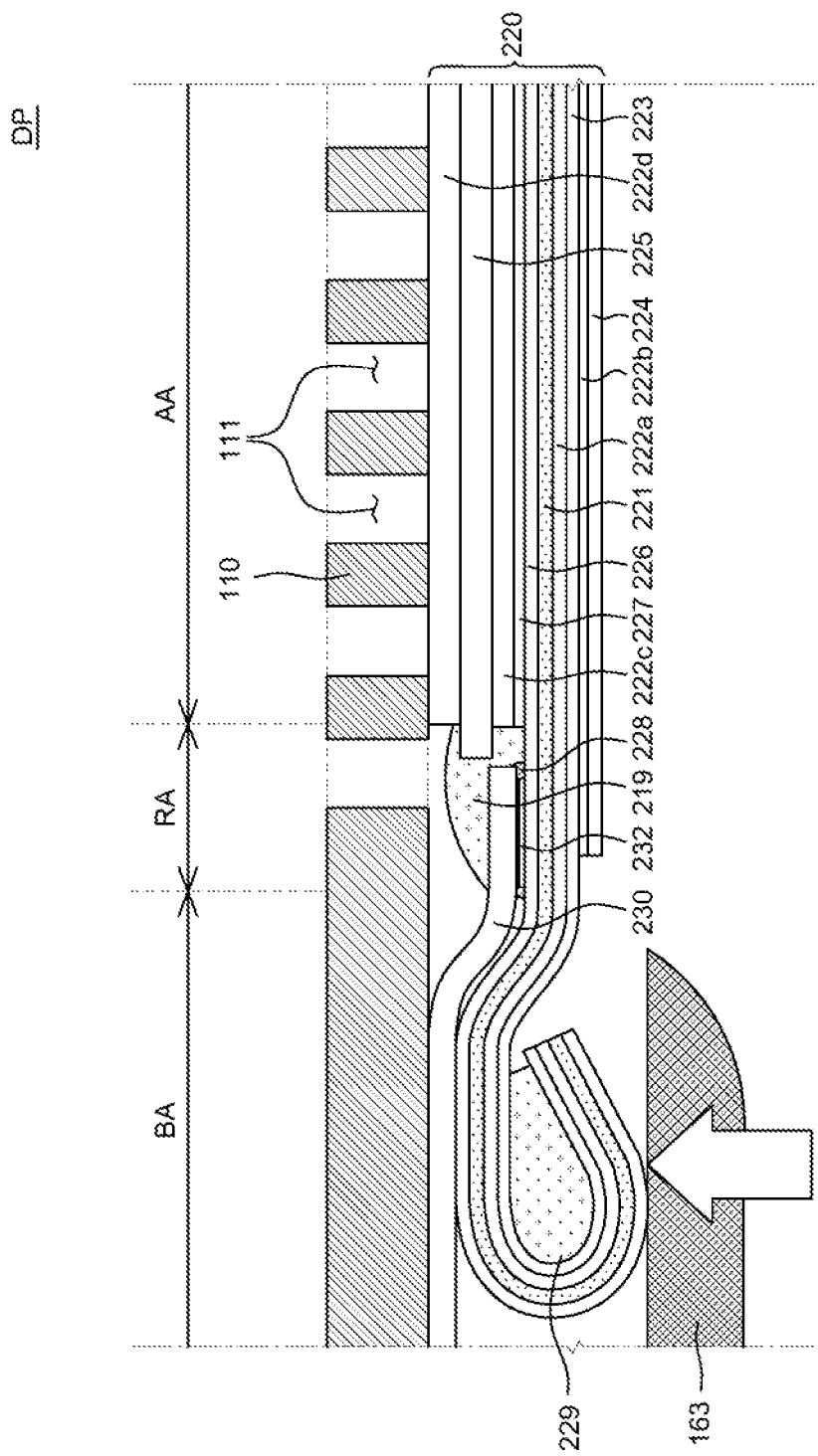
FIG. 9 is a cross-sectional view showing a part of a display device according to a second exemplary aspect of the present disclosure.

FIG. 9 is a cross-sectional view showing a part of a display device according to a second exemplary aspect of the present disclosure.

A display device according to the second exemplary aspect of FIG. 9 is substantially identical to the display device according to the first exemplary aspect of FIG. 6 except for the structure of a buffer zone BA. Like reference numerals designate like elements.

Referring to FIG. 9, a display part DP may include a back cover 110, a display panel 220, a flexible film 230 and a printed circuit board.

The back cover 110 may be disposed on the rear surface of the display panel 220 to support the display panel 220, a plurality of flexible films 230 and the printed circuit board.

Although the back cover 110 is made of a material having rigidity, at least a part of the back cover 110 may have flexibility so that it can be wound around or unwound from the roller together with the display panel 220. For example, the back cover 110 may be made of a metal material such as steel use stainless (SUS) and Invar, or a material such as plastic. It is to be noted that the material of the back cover 110 may be changed as long as the material satisfies the physical property conditions such as the amount of thermal deformation, the radius of curvature and the strength depending on the design choice.

The back cover 110 may include a plurality of supporting areas and a plurality of flexible areas. In the plurality of supporting areas, no opening 111 is formed. In the plurality of flexible areas, a plurality of openings 111 is formed.

The display panel 220 may be disposed on the upper surface of the back cover 110.

The display panel 220 is a panel for displaying images to a user. In the display panel 220, a display element for displaying images, a driving element for driving the display element, lines for transmitting various signals to the display element and the driving element, etc. may be disposed.

The display panel 220 may include a display area AA and a non-display area NA.

The ends of the flexible films 230 may be disposed in the non-display area NA of the display panel 220 to supply the supply voltage, the data voltage, etc. to the sub-pixels and the driver circuits in the display area AA.

The driver ICs such as the gate driver IC and the data driver IC may be disposed on the flexible films 230. The driver ICs are elements for processing data for displaying images and driving signals for processing the data.

In addition, a plurality of first pads 232 may be disposed in the non-display area NA.

The first pads 232 are conductive elements for transmitting various signals from the flexible film 230 to the display part DP and the driver.

The first pads 232 may transmit various signals such as a data signal, a high-level voltage, a low-level voltage and a clock signal through lines. Although the first pads 232 are formed on the buffer layer 226 in the example shown in FIG. 9, the present disclosure is not limited thereto. The first pads 232 may be formed on a variety of insulating layers that may be disposed in the non-display area NA, e.g., on an inorganic insulating layer.

The flexible films 230 may be electrically connected to the first pads 232 disposed on a substrate 221.

A conductive adhesive layer 228 may be disposed between the substrate 221 and the flexible film 230. The conductive adhesive layer 228 may fix the substrate 221 to the flexible films 230 and may electrically connect the first pads 232 on the substrate 221 with a second pad of the flexible films 230.

The display part DP according to the exemplary aspect of the present disclosure may further include a cover unit.

The cover unit according to the exemplary aspect of the present disclosure may include a base plate 161, a bottom plate 162 and a cover plate 163.

The cover plate 163 may be disposed on the surface of the back cover 110.

The display panel 220 may include the substrate 221, the buffer layer 226, a pixel portion 227, an encapsulation layer 222c and an encapsulation substrate 225.

The buffer layer 226 may be disposed on the substrate 221.

The pixel portion 227 is disposed on the substrate 221 and the buffer layer 226. The pixel portion 227 may include a plurality of organic light-emitting elements and circuits for driving the organic light-emitting elements.

Although not shown in the drawings, a thin-film transistor may be disposed on the pixel portion 227 above the substrate 221.

The encapsulation layer 222c may be disposed to cover the pixel portion 227.

The encapsulation layer 222c seals the organic light-emitting element of the pixel portion 227.

The encapsulation substrate 225 is disposed on the encapsulation layer 222c. For example, the encapsulation substrate 225 may be disposed between the encapsulation layer 222c and the back cover 110. The encapsulation substrate 225 can protect the organic light-emitting element of the pixel portion 227 together with the encapsulation layer 222c.

An adhesive layer may be disposed between the encapsulation layer 222c and the encapsulation substrate 225.

An adhesive member 222d may be disposed between the encapsulation substrate 225 and the back cover 110.

A barrier film 223 may be disposed under the substrate 221.

A first adhesive layer 222a may be disposed between the barrier film 223 and the substrate 221.

A polarizing plate 224 may be disposed under the barrier film 223.

A second adhesive layer 222b may be disposed between the barrier film 223 and the polarizing plate 224.

A sealing layer 219 may be disposed above the buffer layer 226 in the non-display area NA of the substrate 221. The sealing layer 219 may be disposed to cover one end of the flexible film 230.

The sealing layer 219 may be disposed to surround the pixel portion 227, the encapsulation layer 222c and the encapsulation substrate 225 in the non-display area NA.

In the display device according to the second exemplary aspect of the present disclosure, like the first exemplary aspect described above, the buffer zone BA is formed outside the sealing layer 219 by extending the end of the display panel 220, and the cover plate 163 is moved to the buffer zone BA so that it is possible to prevent cracks from occurring in the display panel 220 due to the pressing by the cover plate 163 and the overflow of the sealant.

That is to say, in the display device according to the second exemplary aspect, some of the elements under the pixel portion 227, e.g., the substrate 221, the buffer layer 226, the first adhesive layer 222a and the barrier film 223 are extended from the routing area RA of the display panel 220, and thus the buffer zone BA not having the level differences due to the COF, the ACF and the sealing layer 219 is formed. In such case, the second adhesive layer 222b and the polarizing plate 224 may be extended only to the routing area RA.

In addition, the cover plate 163 for preventing delamination of the display panel 220 is moved to the buffer zone BA.

In addition, in the display device according to the second exemplary aspect, the ends of the substrate 221, the buffer layer 226, the first adhesive layer 222a and the barrier film 223 are extended to turn around once counterclockwise, and the space therein is filled with the cushion layer 229.

The ends of the substrate 221, the buffer layer 226, the first adhesive layer 222a and the barrier film 223 turning around the cushion layer 229 once may face the barrier film 223.

The cushion layer 229 may have a variety of shapes such as a circular shape, a semi-circular shape and an amorphous shape in addition to the streamline shape shown in the drawings.

The barrier film 223, the first adhesive layer 222a, the substrate 221 and the buffer layer 226 may be disposed on the cushion layer 229 in this order from inside toward outside.

The barrier film 223, the first adhesive layer 222a, the substrate 221 and the buffer layer 226 may be disposed under the cushion layer 229 in this order from inside toward outside.

The flexible film 230 may be in contact with and disposed on a part of the buffer layer 226 which is located above the cushion layer 229.

The cover plate 163 may be in contact with and disposed under the buffer layer 226 below the cushion layer 229.

According to a third exemplary aspect of the present disclosure, the ends of the substrate, the buffer layer, the first adhesive layer and the barrier film may not turn around, unlike the first and second exemplary aspects. The third exemplary aspect will be described in detail below.

Figure 10:
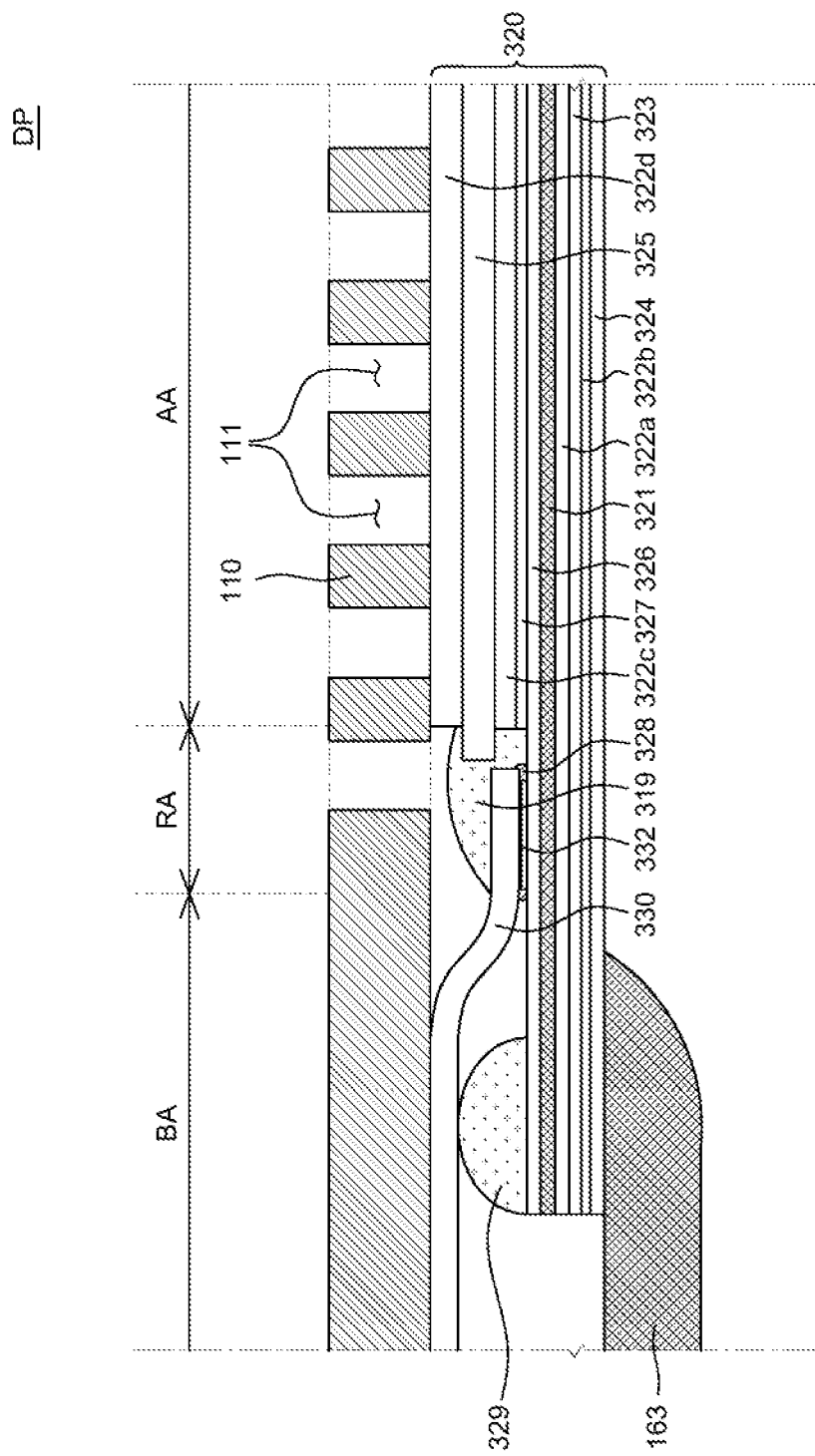
FIG. 10 is a cross-sectional view showing a part of a display device according to a third exemplary aspect of the present disclosure.

FIG. 10 is a cross-sectional view showing a part of a display device according to a third exemplary aspect of the present disclosure.

A display device according to the third exemplary aspect of FIG. 10 is substantially identical to the display device according to the first exemplary aspect of FIG. 6 except for the structure of a buffer area BA. Like reference numerals designate like elements.

Referring to FIG. 10, a display part DP may include a back cover 110, a display panel 320, a flexible film 330 and a printed circuit board.

The display panel 320 may be disposed on the upper surface of the back cover 110.

The display panel 320 may include a display area AA and a non-display area NA.

The ends of the flexible films 330 may be disposed in the non-display area NA of the display panel 320.

In addition, a plurality of first pads 332 may be disposed in the non-display area NA.

The flexible films 330 may be electrically connected to the first pads 332 disposed on a substrate 321.

A conductive adhesive layer 328 may be disposed between the substrate 321 and the flexible film 330.

A buffer layer 326 may be disposed on the substrate 321.

A pixel portion 327 may be disposed on the upper surface of the substrate 321 and the buffer layer 326.

An encapsulation layer 322c may be disposed to cover the pixel portion 327.

An encapsulation substrate 325 may be disposed on the encapsulation layer 322c.

An adhesive member 322d may be disposed between the encapsulation substrate 325 and the back cover 110.

A barrier film 323 may be disposed under the substrate 321.

A first adhesive layer 322a may be disposed between the barrier film 323 and the substrate 321.

A polarizing plate 324 may be disposed under the barrier film 323.

A second adhesive layer 322b may be disposed between the barrier film 323 and the polarizing plate 324.

A sealing layer 319 may be disposed above the buffer layer 326 in the non-display area NA of the substrate 321. The sealing layer 319 may be disposed to cover one end of the flexible film 330.

The sealing layer 319 may be disposed to surround the pixel portion 327, the encapsulation layer 322c and the encapsulation substrate 325 in the non-display area NA.

In the display device according to the third exemplary aspect of the present disclosure, like the first exemplary aspect described above, the buffer zone BA is formed outside the sealing layer 320 by extending the end of the display panel 320, and the cover plate 163 is moved to the buffer zone BA so that it is possible to prevent cracks from occurring in the display panel 320 due to the pressing by the cover plate 163 and the overflow of the sealant.

That is to say, in the display device according to the third exemplary aspect, some of the elements under the pixel portion 327, e.g., the substrate 321, the buffer layer 326, the first and second adhesive layer 322a and 322b, the barrier film 323 and the polarizing plate 324 are extended from the routing area RA of the display panel 320, and thus the buffer zone BA is formed.

In addition, the cover plate 163 for preventing delamination of the display panel 320 is moved to the buffer zone BA.

In addition, in the display device according to the third exemplary aspect, the ends of the substrate 321, the buffer layer 326, the first and second adhesive layer 322a and 322b, the barrier film 323 and the polarizing plate 324 are extended, and the cushion layer 329 are disposed on the ends.

Although the ends of the substrate 321, the buffer layer 326, the first and second adhesive layers 322a and 322b, the barrier film 323 and the polarizing plate 324 are aligned with one another in the example shown in FIG. 10, the present disclosure is limited thereto.

The cushion layer 329 may have a variety of shapes such as a circular shape, a streamlined shape and an amorphous shape in addition to the semi-circular shape shown in the drawings.

The flexible film 330 may be disposed so that it is in contact with the top of the cushion layer 329.

The buffer layer 326, the substrate 321, the first adhesive layer 322a, the barrier film 323, the second adhesive layer 322b and the polarizing plate 324 may be disposed in this order under the cushion layer 329 from upper side toward lower side.

The cover plate 163 may be in contact with and disposed under the polarizing plate 324 below the cushion layer 329.

In the display panel 320 according to the third exemplary aspect of the present disclosure, the display panel 320 can remain flat even in the buffer zone BA, compared to the display panels 120 and 220 according to the first and second exemplary aspects of the present disclosure described above.

The exemplary aspects of the present disclosure can also be described as follows:

According to an aspect of the present disclosure, there is provided a display device. The display device includes a display panel, a back cover supporting the display panel on a rear surface of the display panel, a roller disposed on a rear surface of the back cover, wherein the display panel and the back cover are wound around or unwound from the roller a flexible film electrically connected to a pad area of the display panel and a sealing layer disposed to cover an end of the flexible film, wherein at least some of elements of the display panel including a substrate are extended beyond the sealing layer.

The display device may further include a cover unit including a cover plate in contact with the extended elements of the display panel on an upper surface of the display panel.

The cover unit may further comprise a base plate disposed on the rear surface of the back cover and a bottom plate disposed between the back cover and the cover plate.

The display panel may comprise a buffer layer disposed on the substrate, a pixel portion disposed on the buffer layer, an encapsulation layer disposed on the pixel portion, an encapsulation substrate disposed on the encapsulation layer, a first adhesive layer disposed under the substrate, a barrier film disposed under the first adhesive layer, a second adhesive layer disposed under the barrier film and a polarizing plate disposed under the second adhesive layer.

The sealing layer may be disposed on the buffer layer so as to surround side surfaces of the pixel portion, the encapsulation layer and the encapsulation substrate.

The substrate, the buffer layer, the first adhesive layer, the barrier film, the second adhesive layer and the polarizing plate may be extended beyond the sealing layer.

Ends of the substrate, the buffer layer, the first adhesive layer and the barrier film may be extended more than the second adhesive layer and the polarizing plate and turn around a cushion layer once clockwise.

The ends of the substrate, the buffer layer, the first adhesive layer and the barrier film turning around the cushion layer may face the buffer layer.

The buffer layer, the substrate, the first adhesive layer and the barrier film may be disposed on the cushion layer in this order from inside toward outside, and wherein the flexible film may be in contact with the barrier film.

The buffer layer, the substrate, the first adhesive layer and the barrier film may be disposed under the cushion layer in this order from inside toward outside, and wherein the second adhesive layer and the polarizing plate may be disposed under the barrier film.

The substrate, the buffer layer, the first adhesive layer and the barrier film may be extended beyond the sealing layer.

Ends of the substrate, the buffer layer, the first adhesive layer and the barrier film may be extended more than the second adhesive layer and the polarizing plate and turn around a cushion layer once counterclockwise.

The ends of the substrate, the buffer layer, the first adhesive layer and the barrier film turning around the cushion layer may face the barrier film.

The barrier film, the first adhesive layer, the substrate and the buffer layer may be disposed on the cushion layer in this order from inside toward outside, and wherein the flexible film may be in contact with and disposed on the buffer layer.

The barrier film, the first adhesive layer, the substrate and the buffer layer may be disposed under the cushion layer in this order from inside toward outside, and wherein the cover plate may be in contact with and disposed under the buffer layer.

The flexible film may be disposed above the buffer layer with a cushion layer therebetween.

The buffer layer, the substrate, the first adhesive layer, the barrier film, the second adhesive layer and the polarizing plate may be disposed under the cushion layer in this order from upper side toward lower side, and wherein the cover plate may be in contact with and disposed under the polarizing plate.

The cushion layer may have a streamlines shape, a circular shape, a semi-circular shape or an amorphous shape.

At least some of the elements including the substrate may be extended beyond the sealing layer to form a buffer zone, and wherein the sealing layer may be not disposed in the buffer zone where the cover plate is disposed.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
    a display panel;
    a back cover supporting the display panel and disposed on a rear surface of the display panel;
    a roller disposed on a rear surface of the back cover and configured to wind or unwind the display panel and the back cover;
    a flexible film electrically connected to a pad area of the display panel; and
    a sealing layer disposed to cover an end of the flexible film,
    wherein at least one element of the display panel including a substrate is extended beyond the sealing layer.

2. The display device of claim 1, further comprising a cover unit including a cover plate in contact with the extended at least one element on an upper surface of the display panel.

3. The display device of claim 2, wherein the cover unit further comprises:
    a base plate disposed on the rear surface of the back cover; and
    a bottom plate disposed between the back cover and the cover plate.

4. The display device of claim 2, where the display panel comprises:
    a buffer layer disposed on the substrate;
    a pixel portion disposed on the buffer layer;
    an encapsulation layer disposed on the pixel portion;
    an encapsulation substrate disposed on the encapsulation layer;
    a first adhesive layer disposed under the substrate;
    a barrier film disposed under the first adhesive layer;
    a second adhesive layer disposed under the barrier film; and
    a polarizing plate disposed under the second adhesive layer.

5. The display device of claim 4, wherein the sealing layer is disposed on the buffer layer and surrounds side surfaces of the pixel portion, the encapsulation layer and the encapsulation substrate.

6. The display device of claim 4, wherein the substrate, the buffer layer, the first adhesive layer, the barrier film, the second adhesive layer and the polarizing plate are extended beyond the sealing layer.

7. The display device of claim 6, wherein ends of the substrate, the buffer layer, the first adhesive layer and the barrier film are extended more than the second adhesive layer and the polarizing plate and turn around a cushion layer once in a clockwise direction.

8. The display device of claim 7, wherein the ends of the substrate, the buffer layer, the first adhesive layer and the barrier film turning around the cushion layer face the buffer layer.

9. The display device of claim 7, wherein the buffer layer, the substrate, the first adhesive layer and the barrier film are disposed on the cushion layer in this order from inside toward outside, and
    wherein the flexible film is in contact with the barrier film.

10. The display device of claim 7, wherein the buffer layer, the substrate, the first adhesive layer and the barrier film are disposed under the cushion layer in this order from inside toward outside, and wherein the second adhesive layer and the polarizing plate are disposed under the barrier film.

11. The display device of claim 4, wherein the substrate, the buffer layer, the first adhesive layer and the barrier film are extended beyond the sealing layer.

12. The display device of claim 11, wherein ends of the substrate, the buffer layer, the first adhesive layer and the barrier film are extended more than the second adhesive layer and the polarizing plate and turn around a cushion layer once in a counterclockwise direction.

13. The display device of claim 12, wherein the ends of the substrate, the buffer layer, the first adhesive layer and the barrier film turning around the cushion layer face the barrier film.

14. The display device of claim 11, wherein the barrier film, the first adhesive layer, the substrate and the buffer layer are disposed on the cushion layer in this order from inside toward outside, and
wherein the flexible film is in contact with and disposed on the buffer layer.

15. The display device of claim 11, wherein the barrier film, the first adhesive layer, the substrate and the buffer layer are disposed under the cushion layer in this order from inside toward outside, and
wherein the cover plate is in contact with and disposed under the buffer layer.

16. The display device of claim 6, wherein the flexible film is disposed above the buffer layer with a cushion layer therebetween.

17. The display device of claim 16, wherein the buffer layer, the substrate, the first adhesive layer, the barrier film, the second adhesive layer and the polarizing plate are disposed under the cushion layer in this order from upper side toward lower side, and
wherein the cover plate is in contact with and disposed under the polarizing plate.

18. The display device of claim 7, wherein the cushion layer has a streamlines shape, a circular shape, a semi-circular shape or an amorphous shape.

19. The display device of claim 2, wherein the at least one element including the substrate is extended beyond the sealing layer to form a buffer zone, and
wherein the sealing layer is not disposed in the buffer zone where the cover plate is disposed.

20. A display device comprising:
a display panel;
a back cover supporting the display panel and disposed on a rear surface of the display panel;
a roller disposed on a rear surface of the back cover and configured to wind or unwind the display panel and the back cover;
a flexible film electrically connected to a pad area of the display panel;
a sealing layer covering an end of the flexible film, at least one element of the display panel including a substrate being extended beyond the sealing layer to form a buffer zone; and
a cover unit including a cover plate in contact with the extended at least one element of the display panel,
wherein the sealing layer is not disposed in the buffer zone where the cover plate is disposed.

* * * * *